United States Patent
Yadav et al.

(10) Patent No.: US 11,340,986 B1
(45) Date of Patent: May 24, 2022

(54) HOST-ASSISTED STORAGE DEVICE ERROR CORRECTION

(71) Applicant: Western Digital Technologies, Inc., San Jose, CA (US)

(72) Inventors: Akhilesh Yadav, Bangalore (IN); Ramanathan Muthiah, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/176,765

(22) Filed: Feb. 16, 2021

Related U.S. Application Data

(60) Provisional application No. 63/122,536, filed on Dec. 8, 2020.

(51) Int. Cl.
  *G06F 11/00* (2006.01)
  *G06F 11/10* (2006.01)
  *H03M 13/29* (2006.01)

(52) U.S. Cl.
  CPC ..... *G06F 11/1076* (2013.01); *H03M 13/2906* (2013.01)

(58) Field of Classification Search
  None
  See application file for complete search history.

(56) References Cited

U.S. PATENT DOCUMENTS

| | | | | |
|---|---|---|---|---|
| 2006/0253767 A1* | 11/2006 | Winarski | ............ | G06F 11/1088 714/755 |
| 2014/0082456 A1* | 3/2014 | Liu | ..................... | G06F 11/1012 714/764 |
| 2019/0347338 A1 | 11/2019 | Mani et al. | | |
| 2019/0377637 A1 | 12/2019 | Pitchumani et al. | | |
| 2020/0004627 A1* | 1/2020 | Sharon | .................. | G06F 3/0619 |
| 2020/0004628 A1* | 1/2020 | Ben-Rubi | ............ | G06F 12/0875 |
| 2020/0036391 A1* | 1/2020 | Kim | ..................... | H03M 13/616 |
| 2020/0201713 A1* | 6/2020 | Xie | ........................ | H03M 13/35 |
| 2020/0235753 A1 | 7/2020 | Viterbo et al. | | |
| 2021/0081273 A1* | 3/2021 | Helmick | ............. | G06F 9/30189 |

OTHER PUBLICATIONS

S.-H. Lim, J.-B. Lee, G.-M. Kim and W. H. Ahn, "A Stepwise Rate-Compatible LDPC and Parity Management in NAND Flash Memory-Based Storage Devices," in IEEE Access, vol. 8, pp. 162491-162506, 2020, doi: 10.1109/ACCESS.2020.3021498. (Year: 2020).*

\* cited by examiner

*Primary Examiner* — Daniel F. McMahon
(74) *Attorney, Agent, or Firm* — Patent Law Works LLP

(57) ABSTRACT

Systems and methods for host-assisted storage device error correction are described. A host may first encode host data with a forward error correction code (ECC) and send the encoded host data to the storage device. The storage device may further encode the host data using its own ECC. The host may also provide the forward ECC parity information to be stored on the storage device in a different location than the host data. When the host data is read by the storage device, the storage device will decode with its ECC. If the storage device ECC decode is incomplete and the bit error rate is below the recoverable error threshold of the forward error correction, the partially-recovered host data will be sent to the host. The host will complete decode using the forward ECC and parity data. Forward ECC may be selectively applied to important host data.

20 Claims, 9 Drawing Sheets

HOST-ASSISTED STORAGE DEVICE ERROR CORRECTION

TECHNICAL FIELD

The present disclosure generally relates to storage device data error correction and, more particularly, to multilayer error correction in storage devices connected to a host computing system.

BACKGROUND

Storage systems utilize multiple discrete storage devices, generally disk drives (solid-state drives, hard disk drives, hybrid drives, tape drives, etc.) for storing large quantities of data on behalf of a host. These storage systems may vary from single storage devices directly supporting a host system through a peripheral storage interface to multi-device storage systems (often supporting multiple host systems) that include multiple storage devices arranged in an array of drives interconnected by a common communication fabric and, in many cases, controlled by a storage controller, redundant array of independent disks (RAID) controller, or general controller, for coordinating storage and system activities across the array of drives.

In some systems, each storage device may implement error correction codes (ECC) for recovering bit errors in the data written to that storage device's storage medium. For example, hard disk drives, solid state drives, and other storage devices may implement low density parity check codes (LDPC) to provide a desired level of data recovery up to a determined recoverable bit error rate threshold. In addition, some storage devices may implement recovery retry schemes, including heroic error recovery modes that may include varying physical read parameters (e.g., read voltages, timing, etc.), in additional attempts to recover host data where the initial host data read exceeded the recovery capabilities of the ECC. These additional recovery modes generally require additional time and processor use by the storage device and may adversely affect latency, input/output operation rate, and quality of service metrics.

For some critically important host data, ECC protection that improves bit error recovery may be desirable. Storage devices may have processing and other limitations on the level of recoverable bit error rate (BER) that their ECC can practically support, even with heroic recovery modes. Further, the delay and operational disruption of heroic recovery modes may be detrimental to overall system performance and better avoided, if possible.

A multilayer approach to ECC that allows a host system to use its (generally greater) processing capabilities to selectively provide additional ECC protection to that provided by the storage device may be advantageous. An effective way of coordinating multilayer ECC between a host device and a storage device may be needed.

SUMMARY

Various aspects for error correction code (ECC) protection of stored data, particularly host-assisted storage device error correction using a forward error correction scheme to supplement the storage device ECC, are described.

One general aspect includes a system that includes a storage device including a storage interface configured to communicate with a host system, a storage medium configured to store host data, an error correction code engine configured to encode host data using a first error correction code configuration, and a storage device controller configured to: determine a residual error rate for partially-recovered host data from the error correction code engine; determine a forward error correction threshold for the host system, where the forward error correction threshold is based on a second error correction code configuration; and return, based on the residual error rate being less than the forward error correction threshold, the partially-recovered host data to the host system.

Implementations may include one or more of the following features. The storage device controller may be further configured to: read, responsive to returning the partially-recovered host data to the host system, forward error correction parity data from the storage medium; and return the forward error correction parity data to the host system. The storage device controller may be further configured to: allocate storage locations in the storage medium to a plurality of zones; read the partially-recovered host data from a first zone of the plurality of zones; and read the forward error correction parity data from a second zone of the plurality of zones. The storage device controller may be further configured to: allocate the first zone of the plurality of zones to host data enabled for forward error correction; and allocate the second zone of the plurality of zones to host data not enabled for forward error correction. The storage device controller may be further configured to: receive, from the host, a host data block enabled for forward error correction; and encode, using the error correction code engine and the first error correction code configuration, the host data block; and store the encoded host data block to the storage medium. The storage device controller may be further configured to: receive, from the host, a forward error correction indicator corresponding to the host data block; and determine, from the forward error correction indicator, that the host data block is enabled for forward error correction. The storage device controller may be further configured to: receive, from the host and separate from the host data block, forward error correction parity data for the host data block; encode, using the error correction code engine and the first error correction code configuration, the forward error correction parity data; and store the encoded forward error correction parity data to the storage medium. The first error correction code configuration may have a first recoverable bit error rate threshold, the second error correction code configuration may have a second recoverable bit error rate threshold that is greater than the first recoverable bit error rate threshold, and the storage device controller may be further configured to selectively return, responsive to an initial bit error rate of the partially-recovered host data being greater than the first recoverable bit error rate threshold and less than the second recoverable bit error rate threshold, the partially-recovered host data. The storage device controller may be further configured to: generate, by decoding host data using a first recovery mode of the error correction code engine, the partially-recovered host data; selectively initiate, responsive to the partially-recovered host data, a second recovery mode to retry error correction using the error correction code engine; and return, without initiating the second recovery mode, the partially-recovered host data to the host system responsive to the partially-recovered host data being enabled for forward error correction and the residual error rate being less than the forward error correction threshold. The system may further include the host system including a storage interface configured to communicate with the storage device and a forward error correction code engine configured to: encode host data using the second error correction code configuration; generate forward error correction parity data for the encoded host data; receive the partially-recovered host data from the storage device; and decode the partially-recovered host data using the second error code correction configuration and corresponding forward error correction parity data.

Another general aspect includes a computer-implemented method that includes: encoding, in a storage device, host data from a host system using a first error correction code configuration; storing, in a storage medium of the storage device, the encoded host data; reading, from the storage medium of the storage device, the encoded host data; decoding, from the encoded host data in the storage device, partially-recovered host data using the first error correction code configuration; determining, in the storage device, a residual error rate for the partially-recovered host data; determining, in the storage device, a forward error correction threshold for the host system, where the forward error correction threshold is based on a second error correction code configuration; and returning, based on the residual error rate being less than the forward error correction threshold, the partially-recovered host data to the host system.

Implementations may include one or more of the following features. The computer-implemented method may include: reading, responsive to returning the partially-recovered host data to the host system, forward error correction parity data from the storage medium; and returning the forward error correction parity data to the host system. The computer-implemented method may include: allocating storage locations in the storage medium to a plurality of zones; storing, by the storage device, the encoded host data to a first zone of the plurality of zones, where the first zone is allocated to host data enabled for forward error correction; and storing, by the storage device, the forward error correction parity data to a second zone of the plurality of zones. The computer-implemented method may include: receiving, from the host, a host data block in the host data; receiving, from the host, a forward error correction indicator corresponding to the host data block; and determining, from the forward error correction indicator, that the host data block is enabled for forward error correction. The computer-implemented method may include: receiving, from the host and separate from the host data block, forward error correction parity data for the host data block; encoding, in the storage device and using the first error correction code configuration, the forward error correction parity data; and storing, in the storage device, the encoded forward error correction parity data. The computer-implemented method may include selectively returning, responsive to an initial bit error rate of the partially-recovered host data being greater than a first recoverable bit error rate threshold, the partially-recovered host data, where: the first error correction code configuration has the first recoverable bit error rate threshold; the second error correction code configuration has the second recoverable bit error rate threshold; and the second recoverable bit error rate threshold is greater than the first recoverable bit error rate threshold. The computer-implemented method may include: determining, by decoding host data using a first recovery mode of the storage device, the partially-recovered host data; selectively initiating, responsive to the partially-recovered host data, a second recovery mode to retry error correction using the first error correction code configuration; and returning, without initiating the second recovery mode, the partially-recovered host data to the host system responsive to the partially-recovered host data being enabled for forward error correction and the residual error rate being less than the forward error correction threshold. The computer-implemented method may include: encoding, by the host system, host data using the second error correction code configuration, where encoding the host data by the storage device is reencoding the host-encoded host data; generating, by the host system, forward error correction parity data for the host-encoded host data; receiving, by the host system, the partially-recovered host data from the storage device; and decoding, by the host system, the partially-recovered host data using the second error code correction configuration and corresponding forward error correction parity data. The computer-implemented method may include: allocating, by the host system, a host data block in the host data to be enabled for forward error correction; generating, by the host system, a forward error correction indicator; associating, by the host system the forward error correction indicator with the host data block; associating, by the host system, a corresponding forward error correction parity data block with the host data block; sending, from the host system to the storage device, the host data block, the forward error correction indicator, and the corresponding forward error correction parity data block; requesting, by the host system and responsive to receiving the partially-recovered host data, the corresponding forward error correction parity block from the storage device, where the partially-recovered host data includes partially-recovered host data from the host data block; and receiving, by the host system, the corresponding forward error correction parity block, where the corresponding forward error correction parity data includes the corresponding forward error correction parity block.

Still another general aspect includes a storage system that includes: a storage device; a host system; means, in the host system, for host encoding host data using a forward error correction code configuration; means, in the storage device, for storage device encoding the host-encoded host data using a storage device error correction code configuration; means, in the storage device, for generating, from the storage device encoded host-encoded host data, partially-recovered host-encoded host data using the storage device error correction code configuration; means, in the storage device, for determining a residual error rate for the partially-recovered host data; means, in the storage device, for determining a forward error correction threshold for the host system, where the forward error correction threshold is based on the forward error correction code configuration; means, in the storage device, for returning, based on the residual error rate being less than the forward error correction threshold, the partially-recovered host-encoded host data to the host system; and means, in the host system, for decoding the partially-recovered host-encoded host data using the forward error correction code configuration.

The various embodiments advantageously apply the teachings of storage devices and/or storage systems to improve the functionality of such computer systems. The various embodiments include operations to overcome or at least reduce the issues previously encountered in storage systems and, accordingly, are more reliable and/or efficient than other computing systems. That is, the various embodiments disclosed herein include hardware and/or software with functionality to improve error correction of bit errors from the storage device storage medium, such as by using a forward error correction scheme to supplement the storage device ECC. Accordingly, the embodiments disclosed herein provide various improvements to storage networks and/or storage systems.

It should be understood that language used in the present disclosure has been principally selected for readability and instructional purposes, and not to limit the scope of the subject matter disclosed herein.

DETAILED DESCRIPTION

Figure 1:
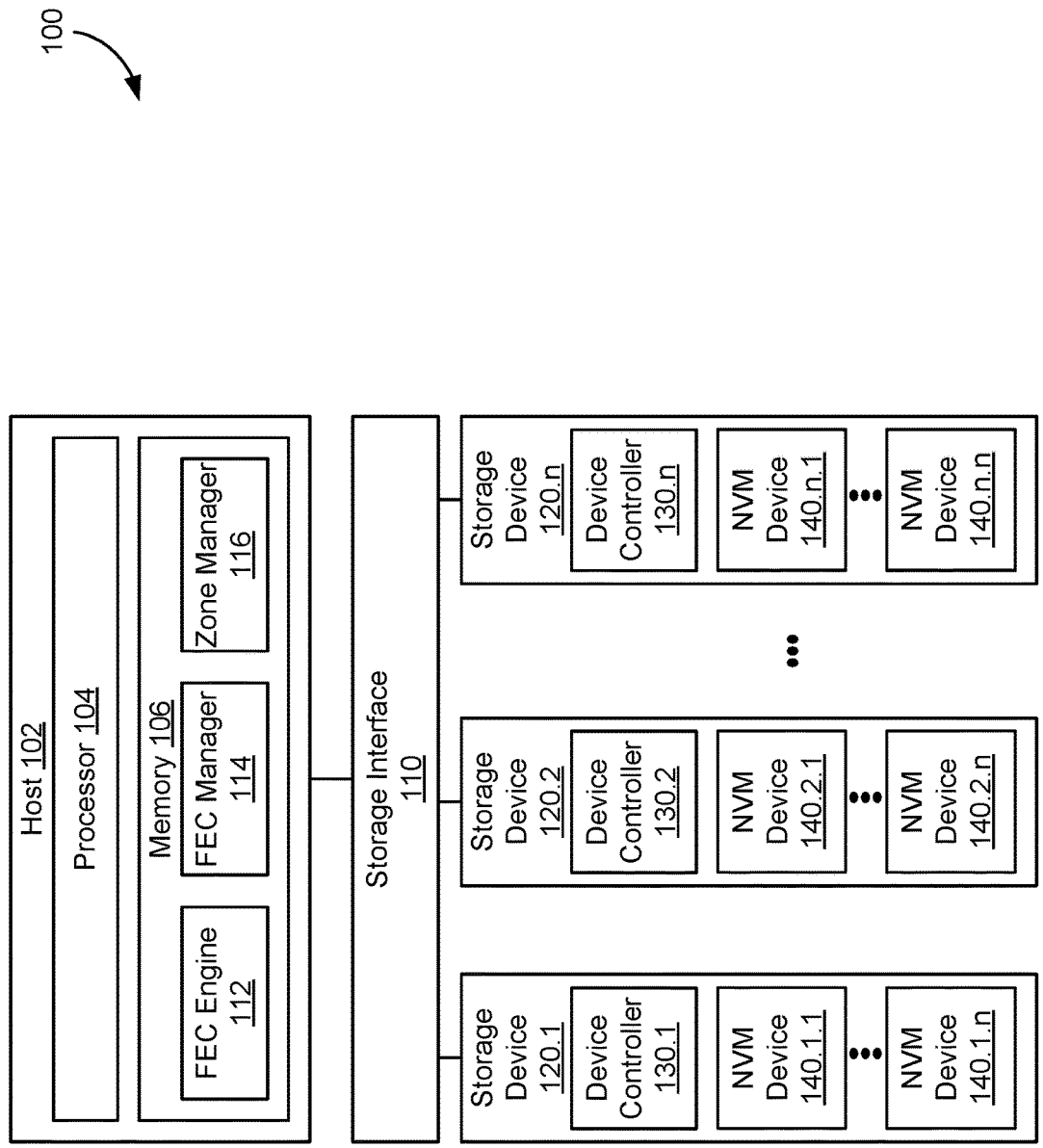
FIG. 1 schematically illustrates a storage system with a host system providing forward error correction.

FIG. 1 shows an embodiment of an example data storage system 100 with multiple data storage devices 120 interconnected by a storage interface 110. While some example features are illustrated, various other features have not been illustrated for the sake of brevity and so as not to obscure pertinent aspects of the example embodiments disclosed herein. To that end, as a non-limiting example, data storage system 100 includes one or more data storage devices 120 (also sometimes called information storage devices, storage devices, disk drives, or drives). In some embodiments, storage devices 120 may be configured in a server or storage array blade or similar storage unit for use in data center storage racks or chassis. Storage devices 120 may interface with one or more hosts 102 and provide data storage and retrieval capabilities for or through those host systems. In some embodiments, storage devices 120 may be configured in a storage hierarchy that includes storage nodes, storage controllers, and/or other intermediate components between storage devices 120 and host 102. For example, each storage controller may be responsible for a corresponding set of storage nodes and their respective storage devices connected through a corresponding backplane network and/or network fabric, though only storage devices 120 and host 102 are shown.

In the embodiment shown, a number of storage devices 120 are attached to a common storage interface 110 for host communication. For example, storage devices 120 may include a number of drives arranged in a storage array, such as storage devices sharing a common rack, unit, or blade in a data center or the solid state drives (SSDs) in an all flash array. In some embodiments, storage devices 120 may share a backplane network, network switch(es), and/or other hardware and software components accessed through storage interface 110. For example, storage devices 120 may connect to storage interface 110 through a plurality of physical port connections that define physical, transport, and other logical channels for establishing communication with the different components and subcomponents for establishing a communication channel to host 102. In some embodiments, storage interface 110 may provide a primary host interface for storage device management and host data transfer, as well as a control interface that includes limited connectivity to the host for low-level control functions, such as through a baseboard management controller (BMC).

In some embodiments, data storage devices 120 are, or include, solid-state drives (SSDs). Each data storage device 120.1-120.$n$ may include a non-volatile memory (NVM) or storage device controller 130 based on compute resources (processor and memory) and a plurality of NVM or media devices 140 for data storage (e.g., one or more NVM device(s), such as one or more flash memory devices). In some embodiments, a respective data storage device 120 of the one or more data storage devices includes one or more NVM controllers, such as flash controllers or channel controllers (e.g., for storage devices having NVM devices in multiple memory channels). In some embodiments, data storage devices 120 may each be packaged in a housing, such as a multi-part sealed housing with a defined form factor and ports and/or connectors for interconnecting with storage interface 110.

In some embodiments, a respective data storage device 120 may include a single medium device while in other embodiments the respective data storage device 120 includes a plurality of media devices. In some embodiments, media devices include NAND-type flash memory or NOR-type flash memory. In some embodiments, data storage device 120 may include one or more hard disk drives (HDDs). In some embodiments, data storage devices 120 may include a flash memory device, which in turn includes one or more flash memory die, one or more flash memory packages, one or more flash memory channels or the like. However, in some embodiments, one or more of the data storage devices 120 may have other types of non-volatile data storage media (e.g., phase-change random access memory (PCRAM), resistive random access memory (ReRAM), spin-transfer torque random access memory (STT-RAM), magneto-resistive random access memory (MRAM), etc.).

In some embodiments, each storage device 120 includes a storage device controller 130, which includes one or more processing units (also sometimes called CPUs or processors or microprocessors or microcontrollers) configured to execute instructions in one or more programs. In some embodiments, the one or more processors are shared by one or more components within, and in some cases, beyond the function of the device controllers. Media devices 140 may be coupled to device controllers 130 through connections that typically convey commands in addition to data, and optionally convey metadata, error correction information and/or other information in addition to data values to be stored in media devices and data values read from media devices 140. Media devices 140 may include any number (i.e., one or more) of memory devices including, without limitation, non-volatile semiconductor memory devices, such as flash memory device(s).

In some embodiments, media devices 140 in storage devices 120 are divided into a number of addressable and individually selectable blocks, sometimes called erase blocks. In some embodiments, individually selectable blocks are the minimum size erasable units in a flash memory device. In other words, each block contains the minimum number of memory cells that can be erased simultaneously (i.e., in a single erase operation). Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector or codeword, which is a subunit of a page. That is, a block includes a plurality of pages, each page contains a plurality of sectors or codewords, and each sector or codeword is the minimum unit of data for reading data from the flash memory device.

A data unit may describe any size allocation of data, such as host block, data object, sector, page, multi-plane page, erase/programming block, media device/package, etc. Storage locations may include physical and/or logical locations on storage devices 120 and may be described and/or allocated at different levels of granularity depending on the storage medium, storage device/system configuration, and/or context. For example, storage locations may be allocated at a host logical block address (LBA) data unit size and addressability for host read/write purposes but managed as pages with storage device addressing managed in the media flash translation layer (FTL) in other contexts. Media segments may include physical storage locations on storage devices 120, which may also correspond to one or more logical storage locations. In some embodiments, media segments may include a continuous series of physical storage location, such as adjacent data units on a storage medium, and, for flash memory devices, may correspond to one or more media erase or programming blocks. A logical data group may include a plurality of logical data units that may be grouped on a logical basis, regardless of storage location, such as data objects, files, or other logical data constructs composed of multiple host blocks. In some configurations, logical and/or physical zones may be assigned within the storage devices 120 as groups of data blocks allocated for specified host data management purposes.

In some embodiments, host or host system 102 may be coupled to data storage system 100 through a network interface that is part of host fabric network that includes storage interface 110 as a host fabric interface. In some embodiments, multiple host systems 102 (only one of which is shown in FIG. 1) are coupled to data storage system 100 through the fabric network, which may include a storage network interface or other interface capable of supporting communications with multiple host systems 102. The fabric network may include a wired and/or wireless network (e.g., public and/or private computer networks in any number and/or configuration) which may be coupled in a suitable way for transferring data. For example, the fabric network may include any means of a conventional data communication network such as a local area network (LAN), a wide area network (WAN), a telephone network, such as the public switched telephone network (PSTN), an intranet, the internet, or any other suitable communication network or combination of communication networks.

Host system 102, or a respective host in a system having multiple hosts, may be any suitable computer device, such as a computer, a computer server, a laptop computer, a tablet device, a netbook, an internet kiosk, a personal digital assistant, a mobile phone, a smart phone, a gaming device, or any other computing device. Host system 102 is sometimes called a host, client, or client system. In some embodiments, host system 102 is a server system, such as a server system in a data center, or a storage system, such as a storage array in a data center. In some embodiments, the one or more host systems 102 are one or more host devices distinct from a storage controller or storage node housing the plurality of storage devices 120. The one or more host systems 102 may be configured to store and access data in the plurality of storage devices 120.

Host system 102 may include one or more central processing units (CPUs) or processors 104 for executing compute operations or instructions for accessing storage devices 120 through storage interface 110. In some embodiments, processor 104 may be associated with operating memory 106 for executing both storage operations and a storage interface protocol compatible with storage interface 110 and storage devices 120. In some embodiments, a separate storage interface unit (not shown) may provide the storage interface protocol and related processor and memory resources. From the perspective of storage devices 120, storage interface 110 may be referred to as a host interface and provides a host data path between storage devices 120 and host 102.

Host system 102 may include memory 106 configured to support various data access and management functions, generally in support of one or more applications. Memory 106 may include a random access memory (RAM) or another type of dynamic storage device that stores information and instructions for execution by processor 512 and/or a read only memory (ROM) or another type of static storage device that stores static information and instructions for use by processor 512 and/or any suitable storage element such as a hard disk or a solid state storage element. For example, memory 106 may include one or more dynamic random access memory (DRAM) devices for use by storage devices 120 for command, management parameter, and/or host data storage and transfer. In some embodiments, storage devices 120 may be configured for direct memory access (DMA), such as using remote direct memory access (RDMA) protocols, over storage interface 110 to interact with host 102.

Host system 102 may be configured to assist storage devices 120 with multilayer ECC processing based on a forward error correction (FEC) code implemented at the host-level. For example, host system 102 may selectively encode host data using a FEC engine 112 before sending host data to storage devices 120 and receive partially-recovered host data from storage devices 120 to further decode using FEC engine 112. Host system 102 may include a plurality of modules or subsystems that are stored and/or instantiated in memory 106 for execution by processor 104 as instructions or operations. For example, memory 106 may include FEC engine 112 configured as an ECC encoder/decoder implementing the forward ECC configuration of host system 102. For example, memory 106 may include a FEC manager 114 configured to manage storage operations using FEC engine 112. For example, memory 106 may include a zone manager configured to allocate and manage zones in storage device 120, including one or more zones allocated for FEC enabled host data.

In some embodiments, FEC engine 112 may include an interface protocol and/or set of functions, parameters, and/or data structures for encoding and decoding target host data blocks using a forward ECC configuration. For example, FEC engine 112 may include an encoder/decoder configured with an ECC algorithm and related parameters for setting parity level and/or recoverable bit error rate threshold. In some embodiments, ECC algorithms may be selected for implementing turbo codes, LDPC codes, Hamming codes, Reed-Solomon codes, Bose-Chaudhuri-Hocquenghem (BCH), etc. The selected error correcting code may be configured with parameters such as block size, parity level, interleaver, recoverable BER threshold, etc. In some embodiments, FEC engine 112 may include hardware and/or software encoders and decoders for implementing the coding algorithm and parameters. For example, the encoder/decoder may include a plurality of register-based encoders and decoders for calculating parity for a host block and returning an erasure encoded host block and host-encoded parity data.

In some embodiments, FEC manager 114 may include an interface protocol and/or set of functions, parameters, and/or data structures for selectively using FEC engine 112 for processing host data blocks and managing the related parity data and storage device read/write commands. For example, FEC manager 114 may determine which host data blocks have sufficient criticality to be FEC encoded before sending them to storage devices 120. In some embodiments, FEC manager 114 may generate or modify write commands to denote that they are host FEC enabled, such as using a FEC indicator in a write command tag or parameter. In some embodiments, FEC manager 114 may also store and associate the host FEC parity data with the encoded host data block, enabling the host FEC parity data to be stored separately from the encoded host data block. For example, FEC manager 114 may store cross-references between FEC enabled host data blocks and corresponding host FEC parity data in a FEC map or LBA metadata structure and store the FEC parity in a separate write command to storage devices 120, store the FEC parity data in memory 106, and/or store the FEC parity data to another storage device or system. In some embodiments, FEC manager 114 may also identify read command results including partially-recovered host data with host FEC enabled to be further decoded through FEC engine 112. In some embodiments, FEC manager 114 may also manage the identification and recovery of host FEC parity data corresponding to the returned partially-recovered host data, such as looking up the storage location of the host FEC parity data and using a separate read command to storage devices 120 to receive it.

In some embodiments, zone manager 116 may include an interface protocol and/or set of functions, parameters, and/or data structures for using zoned namespaces in storage devices 120 to manage host FEC enabled host data and/or host FEC parity data, alongside normal host data (non-enabled host data that does not receive host FEC encoding). For example, host system 102 and storage devices 120 may implement the zoned namespace command set as defined for the non-volatile memory express (NVMe) storage protocol. In some embodiments, storage devices 120 may be configured according to zones that align with physical storage characteristics, such as specific non-volatile memory devices 140, pages, erase blocks, or similar memory structures, and zone manager 116 may allocate specific zones to storing FEC enabled host data.

In some embodiments, data storage system 100 includes one or more processors, one or more types of memory, a display and/or other user interface components such as a keyboard, a touch screen display, a mouse, a track-pad, and/or any number of supplemental devices to add functionality. In some embodiments, data storage system 100 does not have a display and other user interface components.

Figure 2:
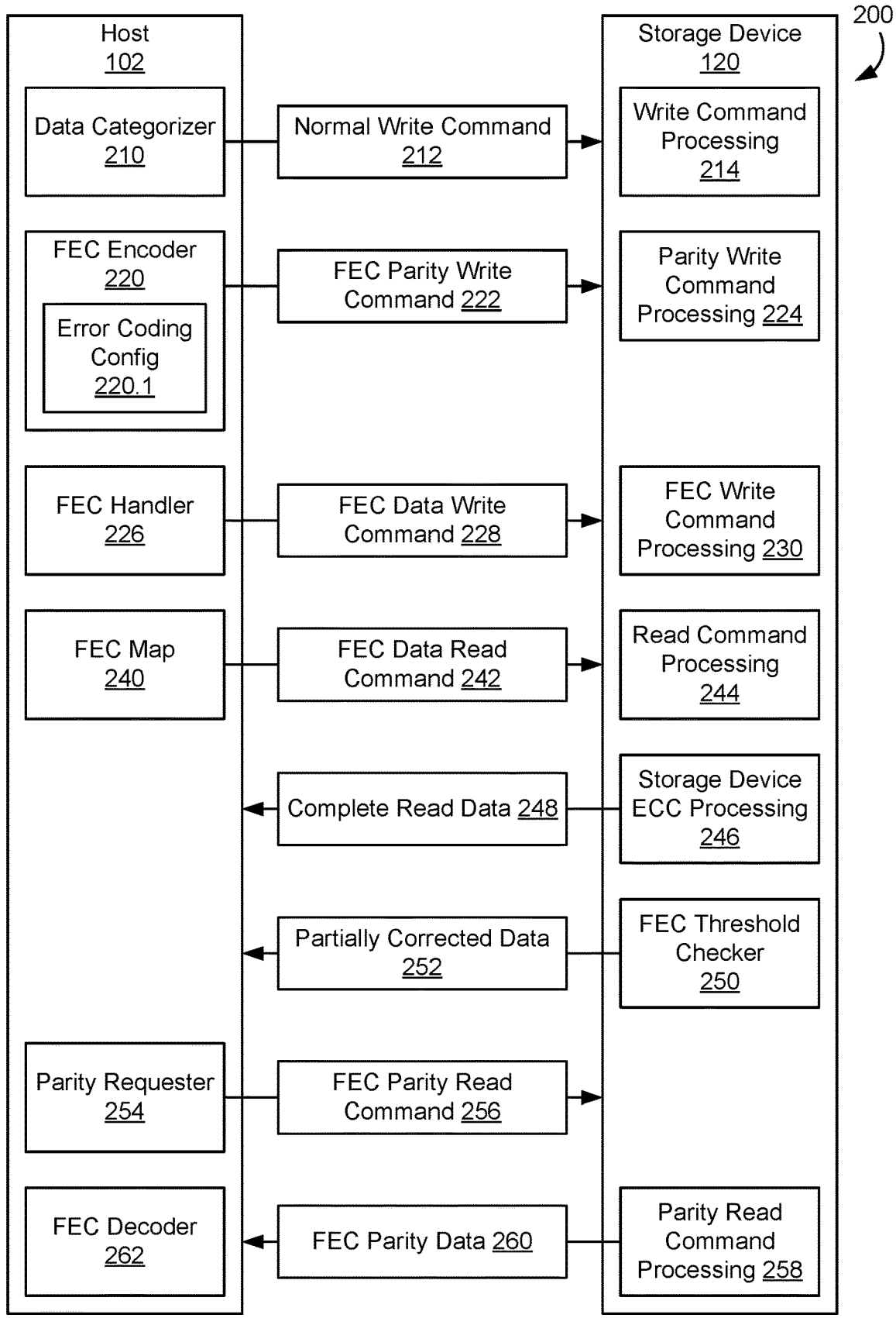
FIG. 2 schematically illustrates a host-assisted ECC architecture that may be used by the storage system of FIG. 1.

FIG. 2 shows a schematic representation of a host-assisted forward ECC architecture that may be used by storage system 100 of FIG. 1. Host system 102 may communicate with storage device 120, such as through storage interface 110, to carry out various storage operations for handling multilevel ECC for selected host data blocks. In some embodiments, the functions of host 102 may be executed by FEC manager 114 with the assistance of FEC engine 112 and the functions of storage device 120 may be executed by storage device controller 130.

Data categorizer 210 may be configured to receive write requests related to one or more applications running on or accessing data through host 102. For example, host 102 may generate and/or process data write requests for host data blocks related to the supported applications. In some embodiments, data categorizer 210 may be configured to evaluate host data blocks to determine whether they should receive the additional ECC protection of host FEC encoding and categorize them accordingly. For example, data categorizer 210 may include a criticality threshold value, each application and/or related host data block may be assigned a data block criticality value, and data categorizer 210 may compare the data block criticality value to the criticality threshold value for each write request. If the data block criticality value meets the criticality threshold value, the host data block may be processed as a host FEC enabled data block. If the data block criticality value is less than the criticality threshold value, the host data block may be processed as a normal data block.

For a normal data block (not enabled for host FEC encoding), a normal write command 212 may be sent to storage device 120. Storage device 120 may include default write command processing 214 for processing write commands that do not indicate that they are host FEC enabled. For example, write command processing 214 may include a check for a host FEC indicator associated with normal write command 212 and, finding none, process the write command according to a normal write path, encoding the host data block using storage device ECC and storing in accordance with the logical block address (LBA) provided in the write command.

For host FEC enabled data blocks, host 102 may pass the host data block to FEC encoder 220. For example, data categorizer 210 may pass the host data block to an encoder register in FEC engine 112. FEC encoder 220 may be configured to encode the host data block using a host forward ECC configuration 220.1. For example, host forward ECC configuration 220.1 may include an ECC algorithm for a specific ECC type, such as turbo code, a set of ECC parameters for block size, code rate, parity level, interleaver, etc., and an associated correctable BER threshold based on the ECC algorithm and parameters. In some embodiments, the correctable BER threshold may be set as the host FEC threshold for host FEC enabled data blocks. FEC encoder 220 may generate one or more host FEC encoded data blocks and corresponding host FEC parity values.

Host 102 may send a FEC parity write command 222 to storage device 120. Storage device 120 may include parity write command processing 224 for processing write commands that indicate that they are FEC parity data. For example, parity write command processing 224 may include a check for a host FEC parity data indicator and process the write command according to a normal write path, encoding the FEC parity data using storage device ECC, and storing in accordance with the LBA provided in the write command. In some embodiments, FEC parity data may be written to an LBA range and/or zone namespace that is separate from the LBA range and/or zone namespace allocated for FEC encoded host data. For example, FEC parity data may be commingled in zones allocated to normal host data and/or have an LBA range and/or zone namespace specifically designated for host FEC parity data. In some embodiments, host 102 may send FEC parity write command 222 to a different storage device (e.g., storage device 120.2) than the storage device (e.g., storage device 120.1) receiving the host FEC encoded data block.

Host 102 may send the host FEC encoded data block to FEC handler 226. For example, FEC handler 226 may generate a FEC data write command 228 that identifies to storage device 120 that the host data block is host FEC enabled. In some embodiments, FEC handler 226 may add a host FEC enabled indicator, such as a tag or parameter in FEC data write command 228. In some embodiments, the host FEC enabled indicator may include the host FEC threshold for use by storage device 120 during read operations for FEC enabled host data. In some embodiments, FEC handler 226 may determine an LBA range or zone namespace for host FEC enabled data blocks and assign a storage location from those allocated storage locations to indicate that the host data block is host FEC enabled.

Host 102 may send FEC data write command 228 to storage device 120. Storage device 120 may include FEC write command processing 230 for processing commands that indicate that they are host FEC encoded data. For example, FEC write command processing 230 may include a check for a host FEC enabled indicator, such as a tag or parameter in FEC data write command 228. In some embodiments, FEC write command processing 230 may use the host LBA or target zone to determine that the received host data block is host FEC enabled. In some embodiments, FEC write command processing 230 may store the host FEC enabled indicator with the host data block or in metadata or FTL data to be able to identify host FEC enabled data blocks during read operations. In some embodiments, FEC write command processing 230 may store the host FEC threshold and associate it with the host data blocks for use during read operations. For example, host data blocks may be tagged with the host FEC enabled indicator and the host FEC threshold value. In some embodiments, the host FEC enabled indicator and the host FEC threshold value may be associated with the host data blocks based on storage location, such as a host LBA range or zoned namespace. In some embodiments, FEC write command processing 230 may proceed through a normal write data path once the host FEC enabled indicator and host FEC threshold values are associated with the host data block. For example, host FEC write command processing 230 may encode the FEC parity data using storage device ECC and store it in accordance with the LBA provided in the write command.

Host 102 may maintain a FEC Map 240 to track host data blocks that have been encoded by FEC encoder 220 and identified as host FEC enabled to storage device 120. For example, a host metadata table may include the host FEC enabled indicator for host FEC enabled data blocks. In some embodiments, when a read request is received or generated for an application, host 102 may check FEC map 240 to determine whether a normal read process or a FEC read process may be used. For example, if the target host data block has a host FEC enabled indicator in FEC map 240, a FEC data read command 242 may be sent to storage device 120.

Read command processing 244 may proceed as normal for FEC data read command 242 and/or normal read commands received from host 102. For example, the storage location of the target host data block may be identified from storage device FTL, the host data block may be read and decoded through storage device ECC processing 246. Upon successful decode by storage device ECC processing 246, where all data bits in the host data block are successfully read from the storage media and/or recovered using storage device ECC, complete read data 248 may be returned to host 102. If the host data block was not host FEC enabled, then the complete read data may be returned to the requesting application. If the host data block was FEC enabled, then it will still need to be processed through FEC decoder 262 to return the original host data (as opposed to the host FEC encoded host data). Upon unsuccessful or partial decode by storage device ECC processing 246, the partially corrected data and residual bit error rate (based on the remaining bit errors after storage device ECC processing) may be passed to a FEC threshold checker 250. In some embodiments, FEC threshold checker 250 may determine whether FEC decoder 262 is capable of recovering the original host data from the partially corrected data prior to returning the partially corrected data. For example, FEC threshold checker 250 may compare the residual bit error rate to the host FEC threshold to determine whether the residual bit error rate is within the correctable bit error rate of error coding configuration 220.1. If the residual bit error rate is within the host FEC threshold, storage device 120 may return partially corrected data 252 to host 102. If the residual error rate exceeds the host FEC threshold, storage device 120 may return an unrecoverable data error.

Once host 102 has received host FEC encoded host data, whether complete read data 248 or partially corrected data 252, the corresponding host FEC parity data may be needed to complete host FEC decoding. In some embodiments, a parity requester 254 may send a FEC parity read command 256 to storage device 120. Storage device 120 may include parity read command processing 258 configured to receive the parity read command and return the FEC parity data. Parity read command processing 258 may proceed as normal for FEC parity read command 256. For example, the storage location of the target parity data block may be identified from storage device FTL, the parity data block may be read and decoded through storage device ECC processing 246, and the FEC parity data 260 may be returned to host 102. Host 102 may use FEC decoder 262 to process host FEC encoded data, whether complete read data 248 or partially corrected data 252, using FEC parity data 260 to return the original host data block.

Figure 3:
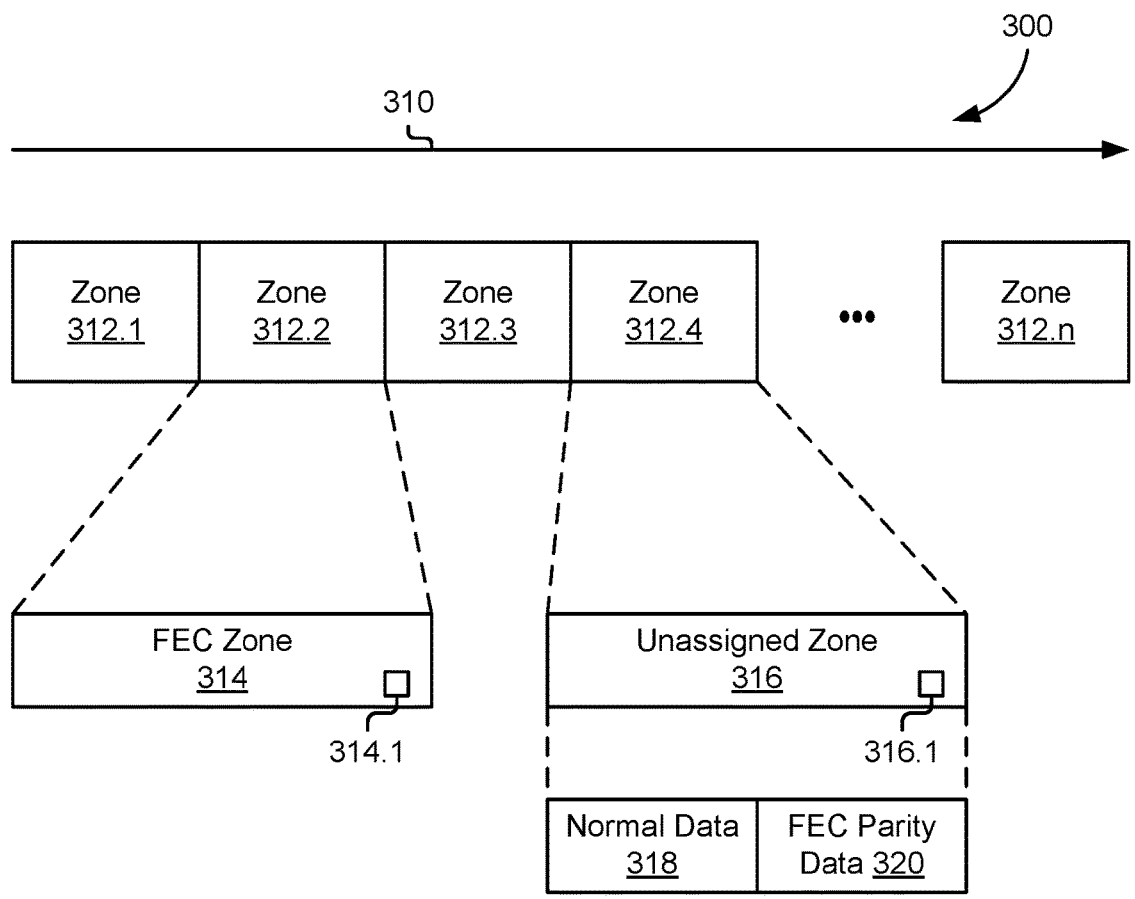
FIG. 3 schematically illustrates a zoned storage architecture that may be used by the storage devices of FIG. 1.

FIG. 3 shows a schematic representation of a zoned storage architecture 300 that may be used by storage system 100 of FIG. 1. For example, host system 102 and storage devices 120 may implement the zoned namespace command set as defined for the NVMe storage protocol. In some embodiments, storage devices 120 may be configured according to zones that align with physical storage characteristics, such as specific non-volatile memory devices 140, pages, erase blocks, or similar memory structures. In some embodiments, host 102 and/or storage device 120 may allocate specific zones to storing FEC enabled host data and/or host FEC parity data.

The physical storage space 310 of a storage device, such as storage device 120, may be divided into a plurality of zones 312.1-312.*n*. Each zone may represented an allocated set of memory locations in the storage medium of the storage device for receiving continuous host data blocks. For example, each zone may have a size or capacity value that may be aligned with flash erase blocks to enable more efficient storage. In some embodiments, the host may allocate zones to specific applications, where each application may map to one or more zones. In addition, some zones may be unallocated for accepting random writes and data for applications that do not have allocated zones.

In some embodiments, at least one host FEC zone 314 may be allocated for receiving host FEC encoded host data blocks, such as host data block 314.1. For example, a zone manager and/or zone management table that designates specific zones and corresponding host LBAs for defined uses may identify an application or system utility that handles critical data that should receive host FEC encoding and/or provides a critical data storage service to other applications for select host data. Host FEC zone 314 may be assigned to such an application in the zone management table. In some embodiments, host FEC zone 314 may be used by both the host system and the storage device to identify host FEC enabled host data blocks and all host data blocks received for FEC zone 314 and read from FEC zone 314 may be assumed to have host FEC encoding. In some embodiments, the host system may provide a FEC capability instruction or configuration parameter to the storage device, where the FEC capability instruction identifies FEC zone 314 and provides the host FEC threshold for use in read path decisions.

In some embodiments, host FEC parity data may be stored separately from the host-encoded FEC data blocks for added data integrity. Using separate zones in physical storage space 310 may assure that host FEC data blocks and their corresponding FEC parity blocks are not stored on the same page, device, or other physical structure corresponding to zones 312. In some embodiments, one or more unassigned zones 316 that include host data blocks 316.1 not enabled for host FEC may be used for receiving FEC parity data 320. For example, host FEC parity data 320 may be stored alongside normal host data 318 in unassigned zone 316. In some embodiments, host FEC parity data 320 may be allocated with its own zone, rather than being randomly allocated across unassigned zones.

Figure 4:
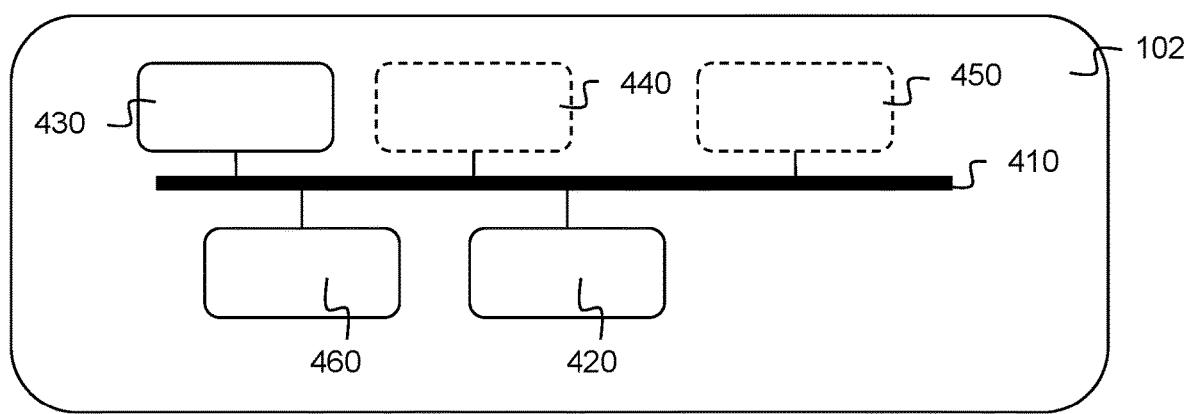
FIG. 4 schematically illustrates a host node of the storage system of FIG. 1.

FIG. 4 shows a schematic representation of an example host system 102. Host system 102 may comprise a bus 410, a processor 420, a local memory 430, one or more optional input units 440, one or more optional output units 450, and a communication interface 460. Bus 410 may include one or more conductors that permit communication among the components of host 102. Processor 420 may include any type of conventional processor or microprocessor that interprets and executes instructions. Local memory 430 may include a random access memory (RAM) or another type of dynamic storage device that stores information and instructions for execution by processor 420 and/or a read only memory (ROM) or another type of static storage device that stores static information and instructions for use by processor 420 and/or any suitable storage element such as a hard disc or a solid state storage element. For example, FEC engine 112, FEC manager 114, and/or zone manager 116 in FIG. 1 may be instantiated in instructions, operations, or firmware stored in local memory 430 for execution by processor 420. An optional input unit 440 may include one or more conventional mechanisms that permit an operator to input information to host 102 such as a keyboard, a mouse, a pen, voice recognition and/or biometric mechanisms, etc. Optional output unit 450 may include one or more conventional mechanisms that output information to the operator, such as a display, a printer, a speaker, etc. Communication interface 460 may include any transceiver-like mechanism that enables host 102 to communicate with other devices and/or systems. In some embodiments, communication interface 460 may include one or more peripheral interfaces, such as a peripheral component interconnect express (PCIe) interface for connecting to storage devices 120 and/or a network interface for communicating with storage devices 120 over a fabric network.

Figure 5:
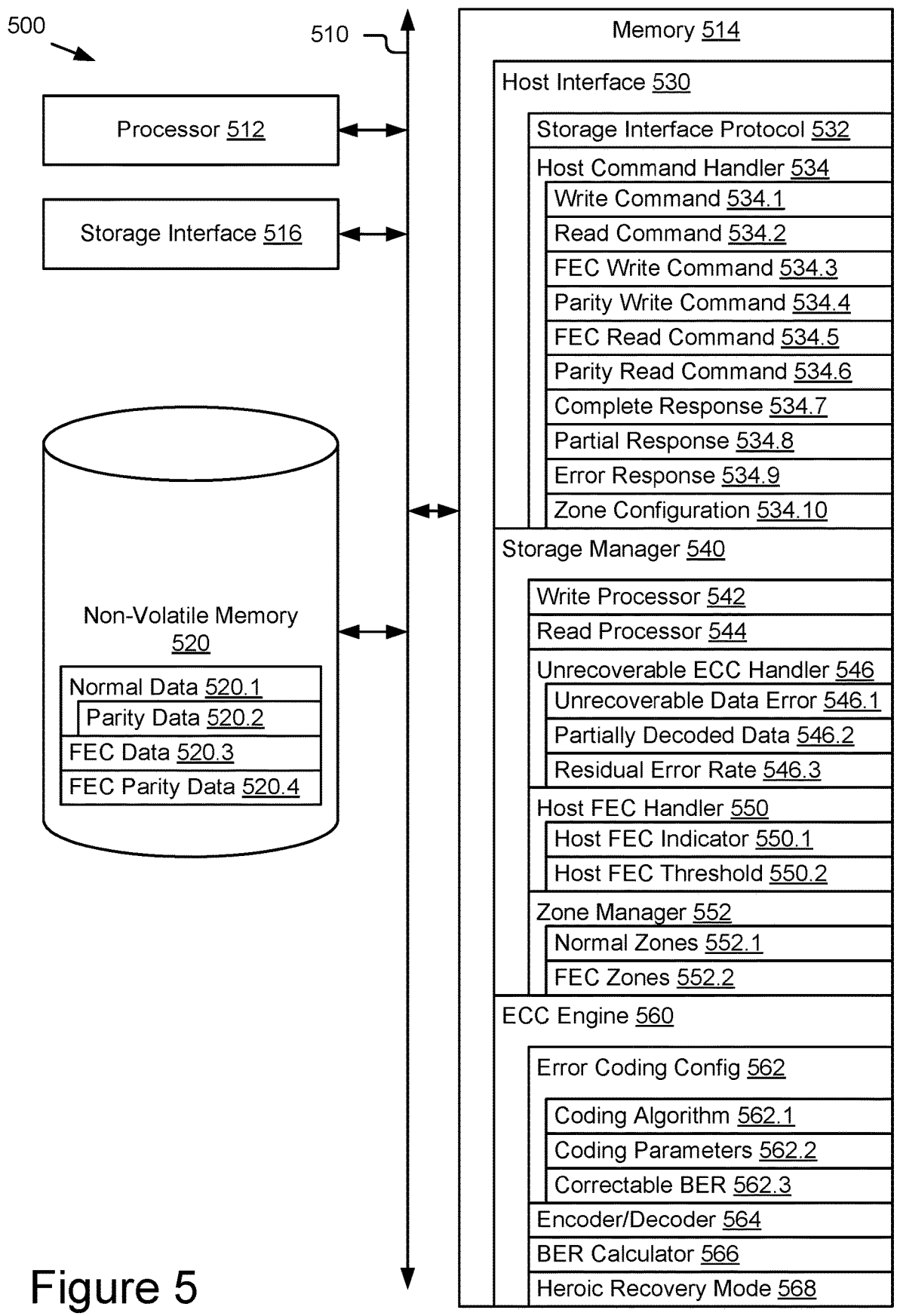
FIG. 5 schematically illustrates some elements of the storage devices of FIG. 1-3 in more detail.

FIG. 5 schematically shows selected modules of a storage device 500 configured for peer supporting host FEC encoded host data, such as storage devices 120. Storage device 500 may incorporate elements and configurations similar to those shown in FIGS. 1-3. For example, storage device 500 may be configured as a storage device 120 in a storage system 100 with a host 102 configured with FEC engine 112, FEC manager 114, and/or zone manager 116.

Storage device 500 may include a bus 510 interconnecting at least one processor 512, at least one memory 514, and at least one interface, such as storage interface 516 and control bus interface 518. Bus 510 may include one or more conductors that permit communication among the components of storage device 500. Processor 512 may include any type of processor or microprocessor that interprets and executes instructions or operations. Memory 514 may include a random access memory (RAM) or another type of dynamic storage device that stores information and instructions for execution by processor 512 and/or a read only memory (ROM) or another type of static storage device that stores static information and instructions for use by processor 512 and/or any suitable storage element such as a hard disk or a solid state storage element. In some embodiments, bus 510, processor 512, memory 514, and/or storage interface 516 may be configured as a storage device controller, such as device controllers 130 in FIG. 1.

Storage interface 516 may include a physical interface for connecting to a host using an interface protocol that supports storage device access. For example, storage interface 516 may include a PCIe, serial advanced technology attachment (SATA), serial attached small computer system interface (SCSI) (SAS), or similar storage interface connector supporting NVMe access to solid state media comprising non-volatile memory devices 520. In some embodiments, storage interface 516 may connect to or incorporate a network interface for connecting to a fabric network and the host. For example, storage interface 516 may connect to a network fabric interface through a backplane network and/or storage network interface controller supporting an NVMe-over-fabric protocol.

Storage device 500 may include one or more non-volatile memory devices 520 configured to store host data. For example, non-volatile memory devices 520 may include a plurality of flash memory packages organized as an addressable memory array. In some embodiments, non-volatile memory devices 520 may include NAND or NOR flash memory devices comprised of single level cells (SLC), multiple level cell (MLC), or triple-level cells.

Storage system 500 may include a plurality of modules or subsystems that are stored and/or instantiated in memory 514 for execution by processor 512 as instructions or operations. For example, memory 514 may include a host interface 530 configured to receive, process, and respond to host data requests from client or host systems. Memory 514 may include a storage manager 540 configured to manage read and write operations to non-volatile memory devices 520. Memory 514 may include an ECC engine 560 configured to process received host data blocks to encode them with storage device ECC and to process encoded data blocks from non-volatile memory devices 520 to decode them with storage device ECC.

Host interface 530 may include an interface protocol and/or set of functions, parameters, and/or data structures for receiving, parsing, responding to, and otherwise managing host data requests from a host. For example, host interface 530 may include functions for receiving and processing host requests for reading, writing, modifying, or otherwise manipulating data blocks and their respective client or host data and/or metadata in accordance with host communication and storage protocols. In some embodiments, host interface 530 may enable direct memory access and/or access over NVMe protocols through storage interface 516. For example, host interface 530 may include host communication protocols compatible with PCIe, SATA, SAS, and/or another bus interface that supports use of NVMe and/or RDMA protocols for data access. Host interface 530 may further include host communication protocols compatible with configuring and enabling host FEC encoded host data to be stored in non-volatile memory devices 520. For example, host interface 530 may receive FEC capability instructions from one or more hosts, where the FEC capability instruction is a command or configuration message specifying a host FEC threshold parameter and/or other host FEC configuration parameters for use when handling FEC read commands. Host FEC parameters may be stored by storage manager 540 for use by FEC handler 550.

In some embodiments, host interface 530 may include a plurality of hardware and/or software modules configured to use processor 512 and memory 514 to handle or manage defined operations of host interface 530. For example, host interface 530 may include a storage interface protocol 532 configured to comply with the physical, transport, and storage application protocols supported by the host for communication over storage interface 516. For example, storage interface protocol 532 may include both PCIe and NVMe compliant communication, command, and syntax functions, procedures, and data structures. In some embodiments, host interface 530 may include a host command handler 534 configured to handle a plurality of host command types and command response types. For example, host command handler 534 may be configured for write command 534.1, read command 534.2, host FEC write command 534.3, host FEC parity write command 534.4, host FEC read command 534.5, host FEC parity read command 534.6, complete read data response 534.7, partial recovery read data response 534.8, read data error response 534.9, and/or zone configuration command 534.10. In some embodiments, host interface 530 may include additional modules (not shown) for buffer management, storage device management and reporting, and other host-side functions.

In some embodiments, each command or command type handled by host command handler 534 may include a distinct set of logical operations related to parsing command parameters related to the command and initiating further processing, such as by initiating one or more processes in storage manager 540. Host command handler 534 may be configured for receiving host data blocks and parsing related write command parameters for write command 534.1. Host command handler 534 may be configured for parsing read command parameters, including a host LBA identifying one or more host data blocks, for read command 534.2. Write command 534.1 and read command 534.2 may each parse their respective write parameters and/or read parameters and pass them to respective processing paths in storage manager 540.

Some read/write parameters may designate specific logic for special handling of select write or read commands. For example, host FEC write command 534.3 may include a write parameter that indicates that the corresponding host data block has been encoded with host forward ECC from the host and enabled for host FEC processing. In some embodiments, host FEC write command 534.3 may include a host FEC indicator value or parameter, such as a tag, that indicates the host block is host FEC enabled. In some embodiments, the host FEC indicator may include a host FEC threshold value indicating the correctable BER threshold for the host ECC configuration and the host FEC indicator and/or host FEC threshold value may be passed to storage manager 540 to be stored in metadata related to the host LBA or otherwise recorded for future use. Host parity write command 534.4 may include a write parameter that indicates that the corresponding host data block contains parity data from host forward ECC encoding. Host parity write command 534.4 may include a host FEC parity indicator value or parameter, such as tag, that indicates that the host block contains parity data and should be stored separately from any related host FEC enabled data blocks. In some embodiments, the host FEC parity indicator may include one or more host LBAs for the host FEC enabled data block(s) to which the parity corresponds. In some embodiments, the only indicator of host FEC write command 534.3 and/or host parity write command 534.4 may be a previously allocated zone or namespace corresponding to the host data block being host FEC enabled or host FEC parity data respectively.

Host FEC read command 534.5 may include a read parameter that indicates that the corresponding host data block has been encoded with host forward ECC from the host and enabled for host FEC processing. In some embodiments, host FEC read command 534.5 may include a host FEC indicator value or parameter, such as a tag, that indicates the host block is host FEC enabled. In some embodiments, the host FEC indicator may include a host FEC threshold value indicating the correctable BER threshold for the host ECC configuration and the host FEC indicator and/or host FEC threshold value may be passed to storage manager 540 to be stored in metadata related to the host LBA or otherwise recorded for future use. Host parity read command 534.6 may include a read parameter that indicates that the corresponding host data block contains parity data from host forward ECC encoding. Host parity write command 534.6 may include a host FEC parity indicator value or parameter, such as tag. In some embodiments, the only indicator of host FEC write command 534.3 and/or host parity write command 534.4 may be a previously allocated zone or namespace corresponding to the host data block being host FEC enabled or host FEC parity data respectively.

Host command handler 534 may also be configured to provide response messages and/or host data blocks to the requesting host in response to host commands, such as read/write commands. In some embodiments, a response message may include host data blocks and/or reference a data transfer location, such as a host or storage device storage buffer, where the host can access or receive the host data blocks. In some embodiments, host command handler 534 may be configured to handle different types of read command responses based on the success of the read operation and/or whether the host data block is host FEC enabled.

Host command handler 534 may return successfully read and completely recovered host data in a complete response 534.7. For example, when storage device ECC successfully reads a host data block, whether normal host data from read command 534.2, host FEC encoded data from host FEC read command 534.5, or host FEC parity data from host FEC parity read command 534.6, the host data block may be returned to the host in complete response 534.7.

Host command handler 534 may return unsuccessfully read and/or partially-recovered host data in a partial response 534.7. For example, when some amount of data is read from the storage media and storage device ECC is not capable of recovering all data bits, the host data that can be read and recovered, though less than the complete data block, may be selectively returned to the host in partial response 534.8. In some embodiments, partial response 534.8 may only be returned if host FEC is enabled for the host data block and the BER of the partially-recovered host data is within the host FEC threshold, as determined by storage manager 540.

Host command handler 534 may return an error message and/or no host data in an error response 534.9. For example, when no data can be read or the partial amount of data is insufficient to recover the host data block, such as when the BER exceeds the correctable BER of the storage device ECC (and the host forward ECC configuration for host FEC enabled data blocks), no host data may be returned by error response 534.9. In some embodiments, error response 534.9 may be the normal response for read commands that target host blocks with too many errors for storage device ECC, but host FEC enabled data blocks may not return error response 534.9 if partial response 534.9 is within the correctable BER of the host forward ECC configuration.

In some embodiments, host command handler 534 may handle one or more commands related to zoned namespaces and their configurations in storage device 120. For example, host command handler 534 may receive zone configuration 534.10 through command or configuration messages. Host command handler 534 may parse zone configuration 534.10 to store configuration parameters, such as zone allocations, to zone manager 552. In some embodiments, zone configuration 534.10 may include a host FEC zone allocation defining a zoned namespace for storing FEC enabled host data. In some embodiments, the host FEC zone may include a parameter for the host FEC threshold to be used for reading host data from the host FEC zone.

Storage manager 540 may include an interface protocol and/or set of functions, parameters, and data structures for reading, writing, and deleting data units in non-volatile memory devices 520. For example, storage manager 540 may include functions for executing host data operations related to host storage commands received through host interface 530. For example, PUT or write commands may be configured to write host data units to non-volatile memory devices 520 through write processor 542. GET or read commands may be configured to read data from non-volatile memory devices 520 through read processor 544. DELETE commands may be configured to delete data from non-volatile memory devices 520, or at least mark a data location for deletion until a future garbage collection or similar operation actually deletes the data or reallocates the physical storage location to another purpose. In some embodiments, storage manager 540 may include flash translation layer (FTL) management, data state machine, read/write buffer management, NVM device interface protocols, NVM device configuration/management/maintenance, and other device-side functions.

In some embodiments, storage manager 540 may include a plurality of hardware and/or software modules configured to use processor 512 and memory 514 to handle or manage defined operations of storage manager 540. For example, storage manager 540 may include a write processor 542 configured to process write operations to non-volatile memory 520 and read processor 544 configured to process read operations from non-volatile memory 520. Storage manager 540 may include an unrecoverable ECC handler 546 configured to determine response and/or further processing in response to unrecoverable data errors ECC engine 560. Storage manager 540 may include a host FEC handler 550 configured to manage the write and read paths for host FEC enabled host data blocks. In some embodiments, storage manager 540 may include a zone manager 552 configured to allocate zones in non-volatile memory devices 520, including one or more zones for host FEC enabled host data blocks.

In some embodiments, write processor 542 may provide a write path for writing host data blocks to non-volatile memory 520. For example, write command 534.1, host FEC write command 534.3, and host parity write command 534.4 may each initiate write processor 542 for writing their corresponding host data to non-volatile memory 520 and variations in those write commands may impact storage location and metadata parameters associated with the host data blocks. Read processor 544 may provide a read path for reading host data block from non-volatile memory 520. For example, read command 534.2, host FEC read command 534.5, and host parity read command 534.6 may each initiate read processor 544 for reading their corresponding host data from non-volatile memory 520. Write processor 542 and read processor 544 may invoke ECC engine 560 to provide storage device ECC encoding and decoding in their respective write and read paths. In some embodiments, data that is written to and read from non-volatile memory 520 without being host FEC enabled, may be written as normal data 520.1 with storage device ECC parity data 520.2 written continuously with the storage device encoded host data. Host FEC data 520.3 may be stored similarly, but in designated storage locations, such as host FEC zones or storage location allocated for host FEC enabled host blocks. In some embodiments, the storage device ECC parity data for the host FEC enabled host blocks may be stored in a continuous storage location with host FEC data 520.3, but host FEC parity data 520.4 may be written to a non-continuous and physically separated storage location, preferably on a separate erase block, page, and/or memory device or package. Host FEC parity data 520.4 may also be encoded with storage device ECC and have storage device ECC parity data stored in a continuous location with the encoded host FEC parity data.

In some embodiments, unrecoverable ECC handler 546 may be configured to receive unrecoverable data errors 546.1 from ECC engine 560. For example, responsive to read processor 544 attempting to read a target host data block from non-volatile memory 520, ECC engine 560 may return unrecoverable data error 546.1 to warn that the host data block was not successfully read. In some embodiments, unrecoverable data error 546.1 may be include, indicate, or provide access to partially decoded data 546.2 and residual error rate 546.3. For example, ECC engine 560 may be configured to write partially decoded data 546.2 to a register or storage buffer during the decoding process and unrecoverable data error 546.1 may include a pointer to that storage location. ECC engine 560 may also detect bit errors and calculate a BER for the partially decoded data 546.2. For example, this residual error rate 546.3 may be included as a parameter in an error message for unrecoverable data error 546.1 or otherwise made available through a register or similar mechanism.

In some embodiments, host FEC handler 550 may be configured to identify host FEC enabled host data blocks during write processing and/or read processing and provide specialized logic for handling host FEC encoded data blocks. For example, host FEC handler 550 may include the logic for determining whether partially decoded data 546.2 is provided to the host in partial response 534.8 or an error is returned in error response 534.9. Storage manager 540 may receive or access host FEC indicator 550.1 associated with a read operation and/or the target host data block and initiate host FEC handler 550. For example, a read operation received by read processor 544 may include host FEC indicator 550.1, such as a tag or parameter, and/or refer to a host LBA associated with host FEC indicator 550.1 in metadata or associated with the zone in which the host data block is stored. Host FEC handler 550 may include or access host FEC threshold 550.2 to be used in evaluating residual error rate 546.3 against the correctable BER of the host forward ECC configuration. For example, FEC handler 550 may store host FEC threshold 550.2 in a configuration page, retrieve host FEC threshold 550.2 from metadata associated with the target host data block or zone, and/or determine it from a parameter in host FEC indicator 550.1. If the host FEC threshold 550.2 is not less than residual error rate 546.3 for partially decoded data 546.2 of a host FEC enabled host data block, then host FEC handler 550 may determine that partially decoded data 546.2 may be provided in partial response 534.8 to the host. If the host FEC threshold 550.2 is less than residual error rate 546.3 for partially decoded data 546.2 of the host FEC enabled host data block, then host FEC handler 550 may determine that no data should be returned in the error response 534.9.

In some embodiments, zone manager 552 may be configured to allocate storage locations to defined zoned namespaces in cooperation with the host system. For example, host zone manager 552 may implement the zoned namespace command set as defined for the NVMe storage protocol. In some embodiments, zone manager 552 may be configured to align zones with physical storage characteristics and allocate normal zones 552.1 for host data that is not host FEC enabled and FEC zones 552.2 to storing FEC enabled host data, as described above with regard for FIG. 3. In some embodiments, zone manager 552 may receive zone configuration 534.10 from host interface 530 and/or store host FEC indicator 550.1 and/or host FEC threshold 550.2 associated with FEC zone 552.2.

ECC engine 560 may include an interface and set of functions, parameters, and data structures for storing, reading, and otherwise managing data ECC encoded by storage device 500, such as erasure encoded data blocks stored in non-volatile memory 520. For example, ECC engine 360 may include functions for encoding a host data block into a storage device ECC encoded data block and decoding a storage device ECC encoded data block back into the original user data symbol. In some embodiments, ECC engine 560 may be included in the write path and/or read path for non-volatile memory 520 that is managed by storage manager 540. In some embodiments, the encoding and decoding functions may be placed in separate encoding engines and decoding engines with redundant and/or shared functions where similar functions are used by both encoding and decoding operations.

In some embodiments, ECC engine 560 may include a plurality of hardware and/or software modules configured to use processor 512 and memory 514 to handle or manage defined operations of ECC engine 560. For example, ECC engine 560 may include an error coding configuration 562, encoder/decoder 564, BER calculator 566, and heroic recovery mode 568.

Erasure coding configuration 562 may include functions, parameters, and/or logic for determining the operations used to encode and decode those host data blocks in accordance with a storage device ECC configuration. For example, various ECC coding algorithms 562.1 exist for providing forward error correction based on transforming a message of a certain number of symbols into a longer message of more symbols such that the original message can be recovered from a subset of the encoded symbols and related parity data. In some embodiments, a message may be split into a fixed number of symbols and these symbols are used as input for ECC coding. The ECC coding algorithm may generate a fixed amount of additional parity data or parity symbols. The sum of these symbols may then be stored to one or more storage locations. In some embodiments, error coding configuration 562 may enable ECC engine 560 to be configured from available ECC coding algorithms 562.1 using a set of coding parameters 562.2. For example, coding algorithms 332.1 may enable selection of an algorithm type, such as parity-based, low-density parity-check codes, Reed-Solomon codes, etc., and one or more coding parameters 562.2, such as number of original symbols, number of encoded symbols, code rate, reception efficiency, parity level, etc. In some embodiments, the combination of coding algorithm 562.1 and coding parameters 562.2 may enable calculation of a correctable BER 562.3 for the storage device ECC configuration. For example, correctable BER 562.3 may be the number of bit errors in a host data block that can be completely recovered using the storage device ECC configuration.

Encoder/decoder 564 may include hardware and/or software encoders and decoders for implementing error coding configuration 562. For example, encoder/decoder 564 may include a plurality of register-based encoders and decoders for calculating parity for a symbol and returning ECC encoded data symbols. In some embodiments, encoder/decoder 564 may be integrated in the write path and read path respectively such that data to be written to storage media and read from storage media pass through encoder/decoder 564 for encoding and decoding in accordance with storage device error coding configuration 562.

Error coding configuration 562 may also enable BER calculation during read operations through encoder/decoder 564 using BER calculator 566. For example, various ECC algorithms incorporate bit error detection and encoder/decoder 564 may be configured to record bit errors as they are encountered and return a bit error total for a decoded data block to BER calculator 566. In some embodiments, BER calculator 566 may use the bit error count and the host data block size to determine a BER. In some embodiments, ECC engine 560 may return read BER, corrected BER, and/or uncorrected BER values as parameters for each read or decode operation. For example, ECC engine 560 may return the uncorrected BER value as residual error rate 546.3 to unrecoverable ECC handler 546.

In some embodiments, ECC engine 560 may include or enable a heroic recovery mode 568. For example, heroic recovery mode 568 may implement one or more recovery retry schemes in additional attempts to recover host data where the initial host data read exceeded correctable BER of storage device error coding configuration 562. In some embodiments, one or more additional error recovery modes may include varying physical read parameters (e.g., read voltages, timing, etc.). Heroic recovery mode 568 may require additional time and processor use by ECC engine 560 and may adversely affect latency, input/output operation rate, and quality of service metrics. In some embodiments, heroic recovery mode 568 may be selectively disabled for host FEC enabled host data blocks with BER that exceed correctable BER 562.3 and are less than host FEC threshold 550.2. For example, storage manager 540 may be configured to determine whether additional recovery modes are initiated in response to unrecoverable data error 546.1 and host FEC handler 550 may be invoked to determine whether partially decoded data 546.2 should be sent to the host based on residual error rate 546.3 and host FEC threshold 550.2.

Figure 6:
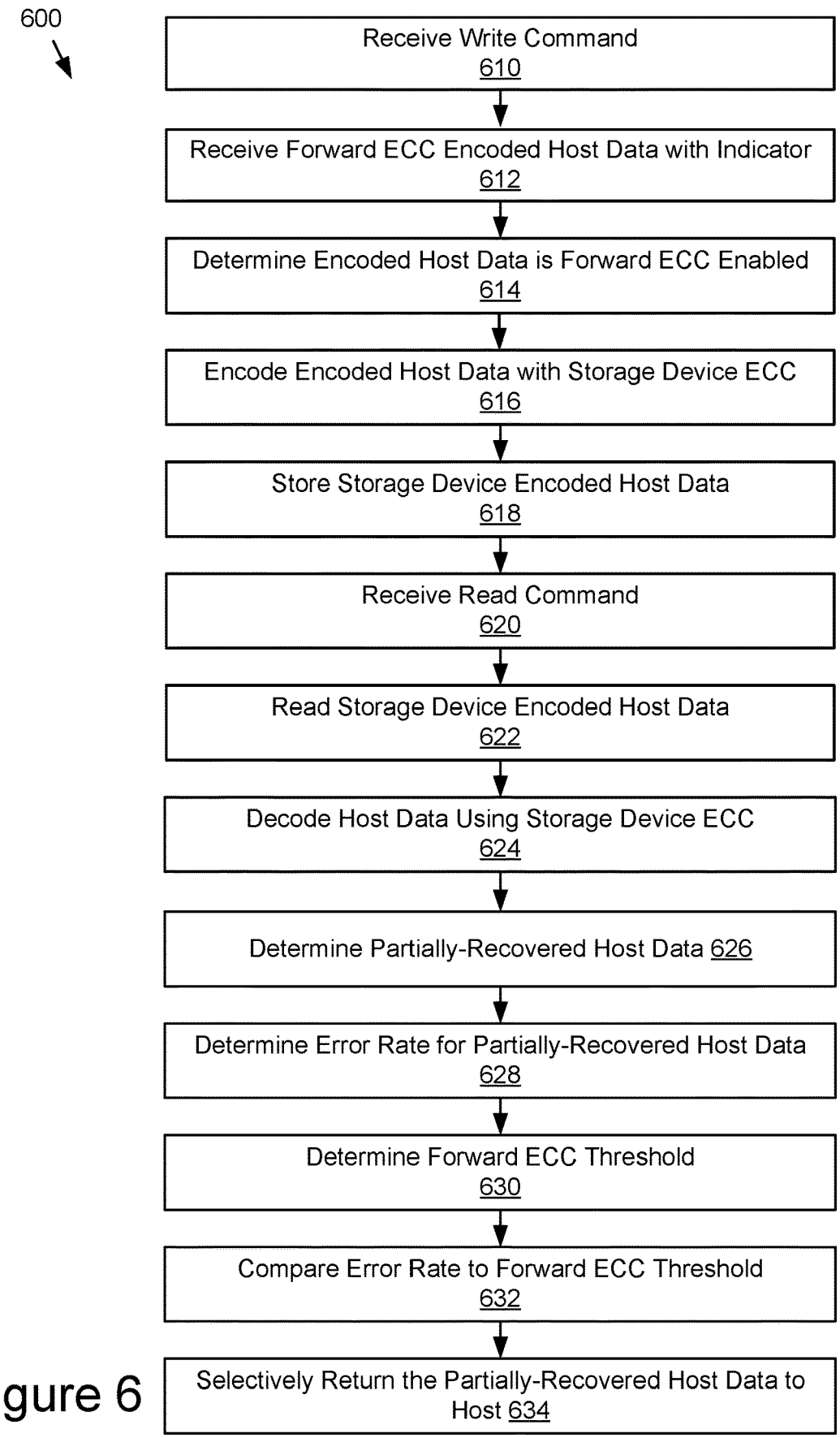
FIG. 6 is a flowchart of an example method of supporting host-assisted ECC using host forward error correction.

As shown in FIG. 6, storage device 500 may be operated according to an example method for supporting host-assisted ECC using host forward error correction, i.e. according to method 600 illustrated by blocks 610-634 in FIG. 6.

At block 610, a write command may be received from a host system. For example, a host command handler in the storage device may receive a write command including at least one host data block and related write parameters.

At block 612, forward ECC encoded host data may be received with a host FEC indicator. For example, the host command handler may receive forward ECC encoded host data through a storage buffer.

At block 614, the encoded host data may be determined to be forward ECC enabled. For example, the host command handler may parse the host FEC indicator from the write command parameters and/or other operational parameters, such as a zoned namespace.

At block 616, the encoded host data may be encoded using storage device ECC. For example, a storage manager may store the host data encoded with host forward ECC configuration through a storage device ECC engine that further encodes the encoded host data using the storage device ECC configuration.

At block 618, the storage device encoded host data may be stored to the storage device storage medium. For example, the storage manager may process the encoded host data through a write path that includes the storage device ECC engine and results in writing the storage device encoded host data to a storage location in the storage device.

At block 620, a read command may be received from the host system for the previously stored host data block with host FEC enabled. For example, the host command handler may receive a read command and related read parameters targeting one or more target host data blocks.

At block 622, storage device encoded host data may be read from the storage device storage medium. For example, the storage manager may initiate a read operation for at least one target host data block through the ECC engine.

At block 624, the host data may be decided using storage device ECC. For example, the raw encoded data may be read from the storage medium by a read channel and provided to the storage device ECC engine for decoding.

At block 626, in some instances, partially-recovered host data may be determined. For example, the storage device ECC engine may be incapable of recovering all encoded host data due to a higher bit error rate than the recoverable BER of the storage device ECC configuration and may provide the partially-recovered encoded host data to the storage manager.

At block 628, an error rate for the partially-recovered host data may be determined. For example, the storage device ECC engine may also determine the bit errors and/or bit error rate during the decode operation and may return at least one bit error rate value to the storage manager.

At block 630, a host forward ECC threshold may be determined. For example, the storage manager may access the host FEC indicator and/or an associated host FEC threshold for the host data block.

At block 632, the bit error rate of the partially-recovered host data may be compared to the host forward ECC threshold. For example, the storage manager may compare the residual bit error rate of the partially-recovered host data from storage device ECC engine to the host FEC threshold to determine whether the partially-recovered host data may be recoverable by the host forward ECC configuration.

At block 634, the partially-recovered host data, still encoded with the host forward ECC configuration, may be selectively returned to the host. For example, if the storage manager determines at block 632 that the residual BER is at or below the host FEC threshold, the storage manager may select to have the host command handler return the partially-recovered host data to the host for further processing using the host forward ECC configuration and ECC decoder.

Figure 7:
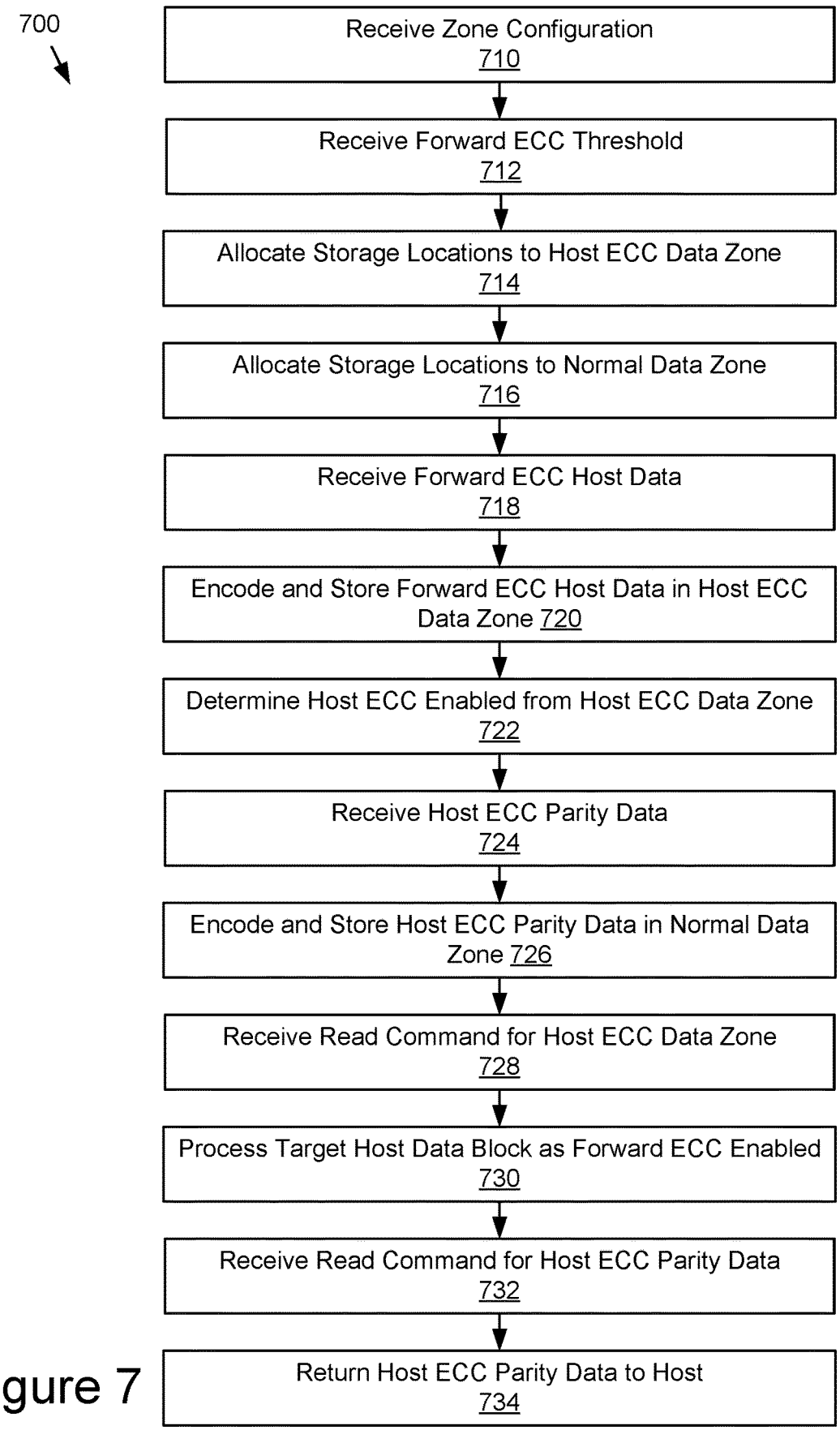
FIG. 7 is a flowchart of another example method of supporting host-assisted ECC using host forward error correction.

As shown in FIG. 7, storage device 500 may be operated according to an example method for supporting host-assisted ECC using host forward error correction, i.e. according to method 700 illustrated by blocks 710-720 in FIG. 7. In some embodiments, one or more blocks of method 700 may be used in conjunction with method 600 in FIG. 6.

At block 710, a zone configuration may be received by a storage device. For example, the storage device may receive a zoned namespace configuration message allocating one or more zones to storing host FEC enabled host data blocks.

At block 712, a host forward ECC threshold may be received. For example, the storage device may receive a host FEC threshold value in a configuration message, such as the configuration message for the corresponding zoned namespace or a separate configuration message or value in a configuration page.

At block 714, storage locations may be allocated to a host ECC data zone. For example, a zone manager for the storage device may store configuration parameters specifying a set of storage locations corresponding to the host FEC zone.

At block 716, storage locations may be allocated to normal data zones. For example, the zone manager may store configuration parameters specifying a set of storage locations corresponding to at least one normal zone for host data blocks that are not enabled for host FEC encoded data.

At block 718, forward ECC encoded host data may be received. For example, a host interface may receive a write command including host data blocks encoded with host forward ECC.

At block 720, the forward ECC encoded host data may be encoded and stored by the storage device in the host ECC data zone. For example, the host ECC encoded host data blocks may be further encoded by a storage device ECC engine on a write path to the storage location allocated to the host FEC zone.

At block 722, the forward ECC encoded host data may be determined to be host ECC enabled from the host ECC data zone. For example, a storage manager may determine that the host data blocks are host FEC enabled from their LBA in the host FEC zone.

At block 724, host ECC parity data may be received. For example, the host interface may receive a separate write command including the host ECC parity data.

At block 726, the host ECC parity data may be encoded and stored by the storage device in the normal data zone. For example, the host ECC parity data blocks may be encoded by the storage device ECC engine on a write path to the storage location allocated to the normal data zone.

At block 728, a read command may be received for a target host data block in the host ECC data zone. For example, the host interface may receive a read command with read parameters for a target host block stored in the host FEC zone.

At block 730, the target host block may be processed as host forward ECC enabled. For example, the target host data block may be determined to be host FEC enabled from its storage location in the host FEC zone and it may be processed to selectively return partially-recovered host data to the host as described with regard to method 600 in FIG. 6.

At block 732, a separate read command may be received for host ECC parity data. For example, the host interface may receive a read command targeting the host data block including the host ECC parity data corresponding to the partially-recovered host data.

At block 734, host ECC parity data may be returned to the host. For example, the read command may be processed through the read channel for reading and decoding from the storage medium using storage device ECC and returning the decoded host data block containing the host ECC parity data to the host.

Figure 8:
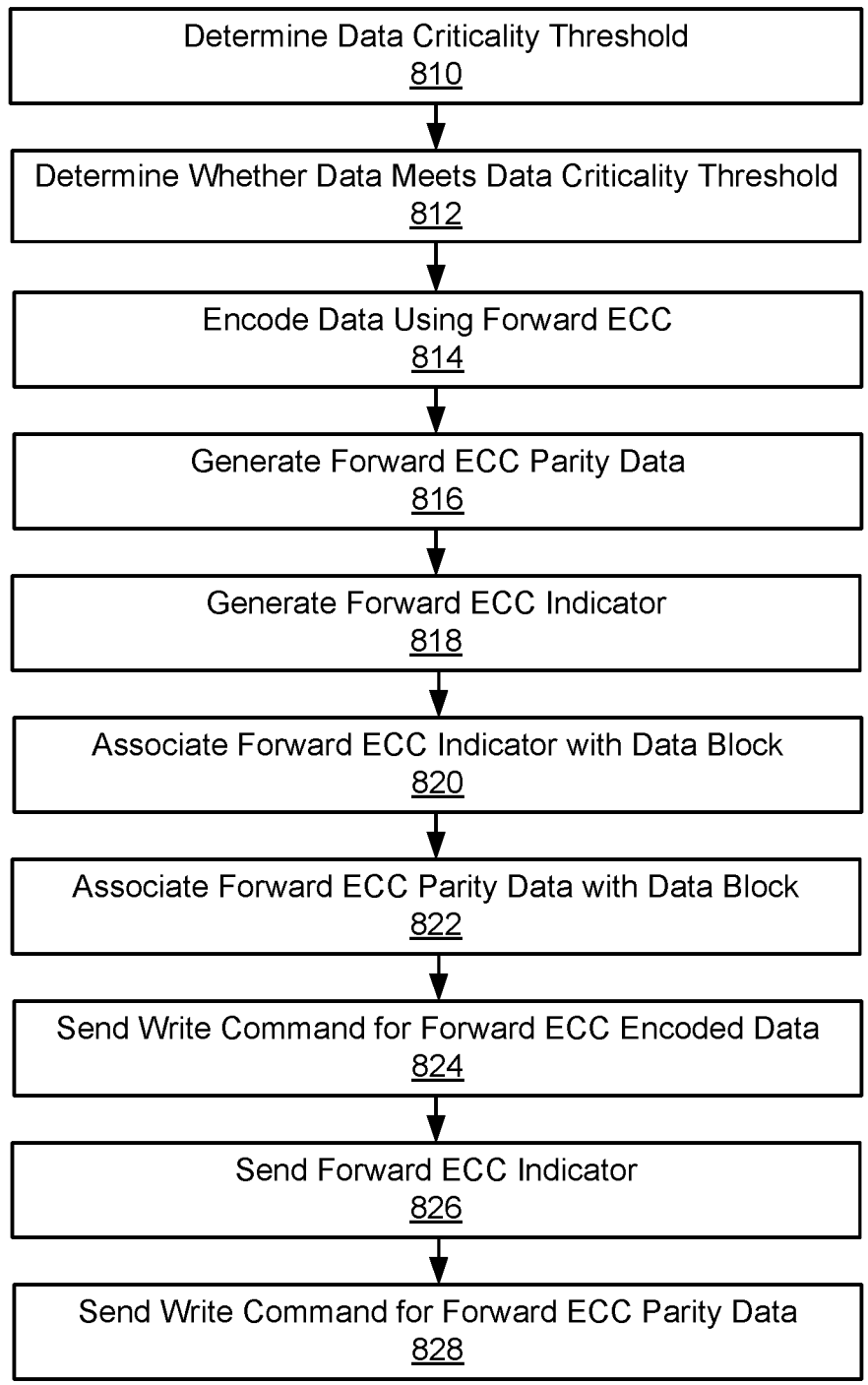
FIG. 8 is a flowchart of an example method of writing host-assisted ECC data to a storage device.

As shown in FIG. 8, storage system 100 may be operated according to an example method for writing host-assisted ECC data to a storage device, i.e. according to method 800 illustrated by blocks 810-828 in FIG. 8.

At block 810, a data criticality threshold may be determined. For example, a FEC manager in the host system may determine a data criticality parameter and corresponding threshold value for determining that a host data block should be stored with added host FEC protection.

At block 812, whether a host data block meets the data criticality threshold may be determined. For example, the FEC manager may compare the data criticality parameter for the target host data block to the data criticality threshold determined at block 810.

At block 814, the host data block may be encoded using forward ECC. For example, the FEC manager may process the host data block through a host ECC engine having a host ECC configuration to generate a host ECC encoded host data block.

At block 816, forward ECC parity data may be generated. For example, processing the host data block through the host ECC engine may also generate forward ECC parity data that may be managed separately from the host ECC encoded host data block.

At block 818, a forward ECC indicator may be generated. For example, the FEC manager may generate a host FEC indicator to indicate that the host data block has been forward ECC encoded by the host.

At block 820, the forward ECC indicator may be associated with the host data block. For example, the FEC manager may provide the forward ECC indicator as a write parameter with the write command and/or store the forward ECC indicator in association with the LBA of the host data block in a FEC map or similar metadata structure.

At block 822, the forward ECC parity data may be associated with the host data block. For example, the FEC manager may assign an LBA or other parity data reference to a second host data object containing the forward ECC parity data and store the parity data reference in association with the LBA of the host data block in the FEC map or similar metadata structure.

At block 824, a write command for the forward ECC encoded host data may be sent to a storage device. For example, the FEC manager may initiate a write command with the forward ECC encoded host data.

At block 826, the forward ECC indicator may be sent to the storage device. For example, the FEC manager may include a host FEC indicator as a write parameter and/or send a separate configuration or operation instruction including the host FEC indicator.

At block 828, a write command for the forward ECC parity data may be sent to the storage device. For example, the FEC manager may initiate a separate write command with the forward ECC parity data in another host data block.

Figure 9:
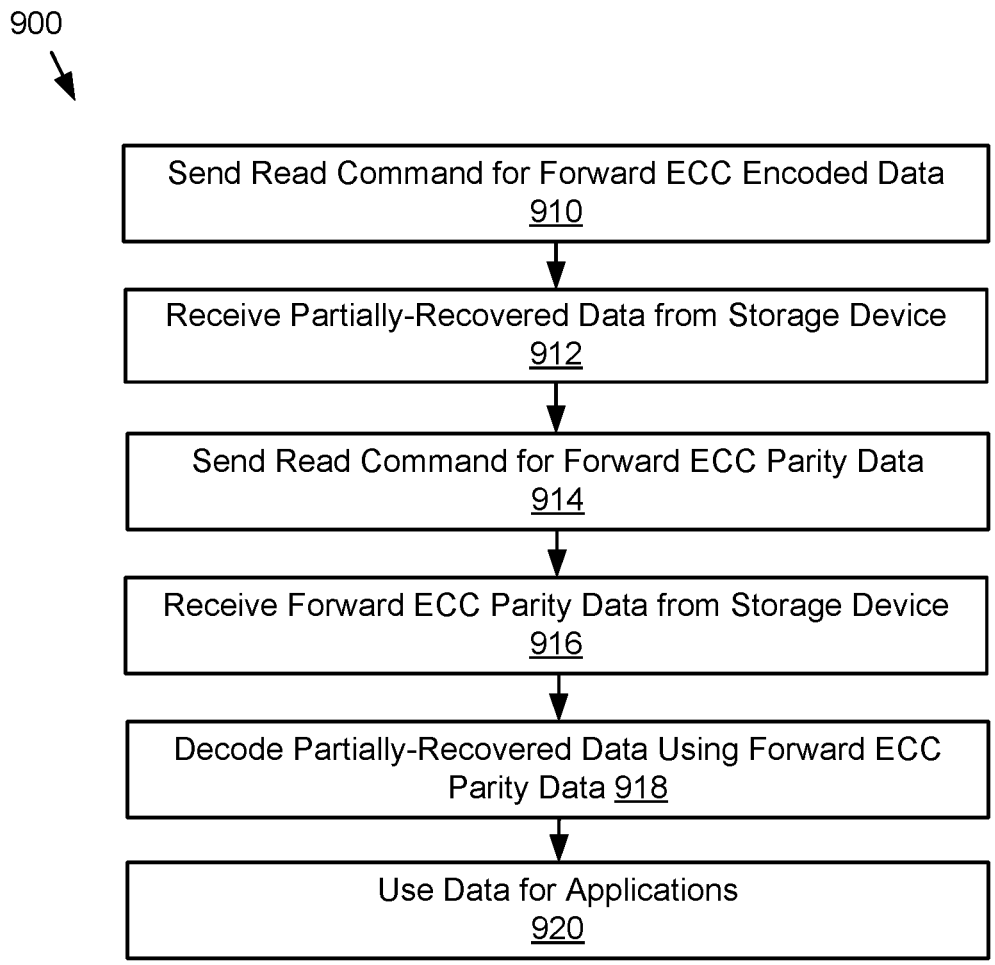
FIG. 9 is a flowchart of an example method of reading host-assisted ECC data from a storage device.

As shown in FIG. 9, storage system 100 may be operated according to an example method for reading host-assisted ECC data from a storage device, i.e. according to method 900 illustrated by blocks 910-920 in FIG. 9.

At block 910, a read command for forward ECC encoded host data may be sent to the storage device where it was written. For example, the FEC manager may initiate a read command to the LBA assigned to a target host data block enabled for host FEC encoding.

At block 912, partially-recovered data corresponding to the forward ECC encoded host data sent to the storage device may be received. For example, the storage device may fail to completely recover the target host data block using storage device ECC and send the partially-recovered data to the host for further recovery efforts.

At block 914, responsive to receiving the partially-recovered data, a read command for the corresponding forward ECC parity data may be sent to the storage device. For example, the FEC manager may use the FEC map to determine the host LBA for the host data block containing the forward ECC parity data corresponding to the target host data block.

At block 916, the forward ECC parity data may be received from the storage device. For example, the storage device may return the host data block containing the forward ECC parity data.

At block 918, the partially-recovered data may be decoded using the forward ECC parity data. For example, the FEC manager may process the partially-recovered data and the forward ECC parity data through a host ECC engine with the same host forward ECC configuration used to forward encode the original host data.

At block 920, the successfully recovered original host data may be used for host applications. For example, the host system may use the original host data for the critical application that originally met the criticality threshold of method 800 in FIG. 8.

Figure 10:
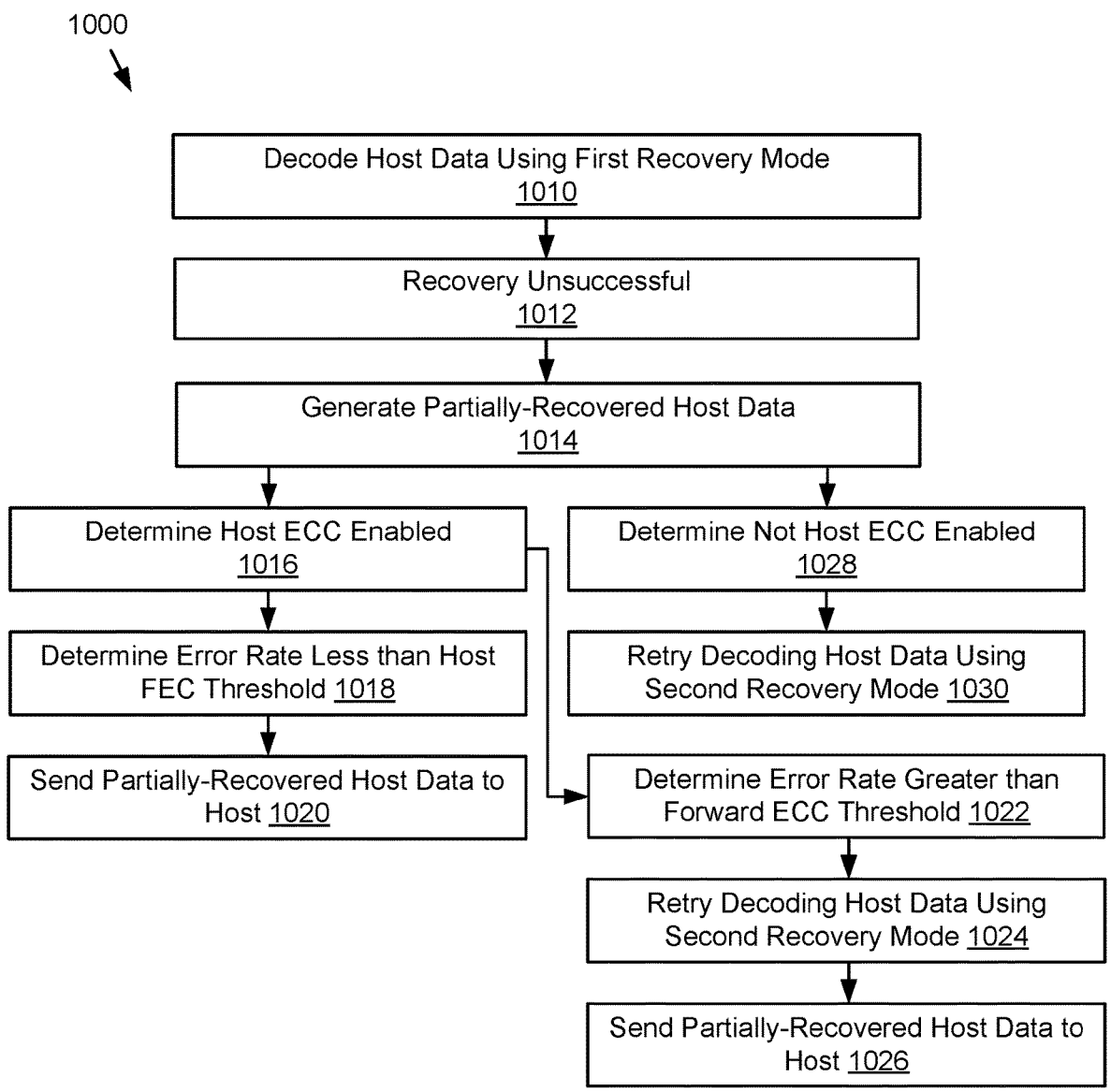
FIG. 10 is a flowchart of an example method of combining host-assisted ECC with additional recovery modes.

As shown in FIG. 10, storage device 500 may be operated according to an example method for combining host-assisted ECC with additional recovery modes, i.e. according to method 1000 illustrated by blocks 1010-1030 in FIG. 10. In some embodiments, one or more blocks of method 1000 may be used in conjunction with method 600 in FIG. 6 and/or method 700 of FIG. 7.

At block 1010, host data may be decoded using a first recover mode. For example, an ECC engine and read channel may use a default read and decode mode to read the raw data from the storage medium and decode the host data.

At block 1012, the host data recovery may be unsuccessful. For example, the bit errors in the raw data may exceed the correctable BER of the storage device ECC engine.

At block 1014, partially-recovered host data may be generated. For example, the ECC engine may decode the raw data into a decoder buffer.

At block 1016, the host data may be determined to be host ECC enabled. For example, the host data may have an associated host FEC indicator.

At block 1018, an error rate of the partially-recovered host data may be determined to be less than a host FEC threshold. For example, a storage manager may compare the residual BER of the partially-recovered host data to the host FEC threshold to determine whether the host forward ECC is capable of recovering the host data.

At block 1020, the partially-recovered host data may be sent to the host. For example, the storage manager may interrupt a series of sequential recovery modes in favor of inducing a "fast fail" and sending the partially-recovered host data to the host to enable the host to complete the host data recovery using host forward ECC.

At block 1022, the error rate of the partially-recovered host data may be determined to be greater than the host FEC threshold. For example, the storage manager may compare the residual BER of the partially-recovered host data to the host FEC threshold and determine that the host forward ECC is not capable of recovering the host data without further improvements in BER.

At block 1024, reading and decoding may be retried using a second recovery mode. For example, the storage manager may initiate a heroic recovery mode with a different set of read parameters in the read channel and/or a different set of decoding parameters in the ECC engine in an attempt to reduce the number of bit errors.

At block 1026, partially-recovered host data with an improved BER may be sent to the host. For example, the storage manager may selectively send the partially-recovered host data from the second or later recovery mode if it successfully reduces the error rate in the partially-recovered host data drops below the host FEC threshold. Otherwise, the storage manager may return an unrecoverable data error per the additional recovery mode or modes.

At block 1028, the host data may be determined to not be host ECC enabled. For example, the host data may not have an associated FEC indicator.

At block 1030, reading and decoding may be retried using the second recover mode. For example, the storage manager may have a default retry configuration that may include one or more retries with one or more additional recovery modes, sometimes including a heroic recovery mode. If these additional attempts are unsuccessful, the storage manager may return an unrecoverable data error.

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disk read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g., through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

The invention claimed is:

1. A system comprising:
a storage device comprising:
    a processor;
    a memory;
    a storage interface configured to communicate with a host system;
    a non-volatile storage medium configured to store host data;
    an error correction code engine, stored in the memory for execution by the processor, configured to encode host data using a first error correction code configuration; and
    a storage device controller, comprising the processor and the memory, configured to:
        determine a residual error rate for partially-recovered host data from the error correction code engine;
        determine a forward error correction threshold for the host system, wherein the forward error correction threshold is based on a second error correction code configuration; and
        return, based on the residual error rate being less than the forward error correction threshold, the partially-recovered host data to the host system.

2. The system of claim 1, wherein the storage device controller is further configured to:
    read, responsive to returning the partially-recovered host data to the host system, forward error correction parity data from the storage medium; and
    return the forward error correction parity data to the host system.

3. The system of claim 2, wherein the storage device controller is further configured to:
    allocate storage locations in the storage medium to a plurality of zones;
    read the partially-recovered host data from a first zone of the plurality of zones; and
    read the forward error correction parity data from a second zone of the plurality of zones.

4. The system of claim 3, wherein the storage device controller is further configured to:
    allocate the first zone of the plurality of zones to host data enabled for forward error correction; and
    allocate the second zone of the plurality of zones to host data not enabled for forward error correction.

5. The system of claim 1, wherein the storage device controller is further configured to:
    receive, from the host system, a host data block enabled for forward error correction;
    encode, using the error correction code engine and the first error correction code configuration, the host data block; and
    store the encoded host data block to the storage medium.

6. The system of claim 5, wherein the storage device controller is further configured to:
    receive, from the host system, a forward error correction indicator corresponding to the host data block; and
    determine, from the forward error correction indicator, that the host data block is enabled for forward error correction.

7. The system of claim 5, wherein the storage device controller is further configured to:
    receive, from the host system and separate from the host data block, forward error correction parity data for the host data block;
    encode, using the error correction code engine and the first error correction code configuration, the forward error correction parity data; and
    store the encoded forward error correction parity data to the storage medium.

8. The system of claim 1, wherein:
    the first error correction code configuration has a first recoverable bit error rate threshold;
    the second error correction code configuration has a second recoverable bit error rate threshold that is greater than the first recoverable bit error rate threshold; and
    the storage device controller is further configured to selectively return, responsive to an initial bit error rate of the partially-recovered host data being greater than the first recoverable bit error rate threshold and less than the second recoverable bit error rate threshold, the partially-recovered host data.

9. The system of claim 1, wherein the storage device controller is further configured to:
    generate, by decoding host data using a first recovery mode of the error correction code engine, the partially-recovered host data;
    selectively initiate, responsive to the partially-recovered host data, a second recovery mode to retry error correction using the error correction code engine; and
    return, without initiating the second recovery mode, the partially-recovered host data to the host system responsive to:
        the partially-recovered host data being enabled for forward error correction; and
        the residual error rate being less than the forward error correction threshold.

10. The system of claim 1, further comprising:
the host system comprising:
    a host processor;
    a host memory;

a storage interface configured to communicate with the storage device; and a forward error correction code engine, stored in the host memory for execution by the host processor, configured to:
encode host data using the second error correction code configuration;
generate forward error correction parity data for the encoded host data;
receive the partially-recovered host data from the storage device; and
decode the partially-recovered host data using the second error code correction configuration and corresponding forward error correction parity data.

11. A computer-implemented method, comprising:
encoding, in a storage device, host data from a host system using a first error correction code configuration;
storing, in a storage medium of the storage device, the encoded host data;
reading, from the storage medium of the storage device, the encoded host data;
decoding, from the encoded host data in the storage device, partially-recovered host data using the first error correction code configuration;
determining, in the storage device, a residual error rate for the partially-recovered host data;
determining, in the storage device, a forward error correction threshold for the host system, wherein the forward error correction threshold is based on a second error correction code configuration; and
returning, based on the residual error rate being less than the forward error correction threshold, the partially-recovered host data to the host system.

12. The computer-implemented method of claim 11, further comprising:
reading, responsive to returning the partially-recovered host data to the host system, forward error correction parity data from the storage medium; and
returning the forward error correction parity data to the host system.

13. The computer-implemented method of claim 12, further comprising:
allocating storage locations in the storage medium to a plurality of zones;
storing, by the storage device, the encoded host data to a first zone of the plurality of zones, wherein the first zone is allocated to host data enabled for forward error correction; and
storing, by the storage device, the forward error correction parity data to a second zone of the plurality of zones.

14. The computer-implemented method of claim 11, further comprising:
receiving, from the host system, a host data block in the host data;
receiving, from the host system, a forward error correction indicator corresponding to the host data block; and
determining, from the forward error correction indicator, that the host data block is enabled for forward error correction.

15. The computer-implemented method of claim 14, further comprising:
receiving, from the host system and separate from the host data block, forward error correction parity data for the host data block;
encoding, in the storage device and using the first error correction code configuration, the forward error correction parity data; and
storing, in the storage device, the encoded forward error correction parity data.

16. The computer-implemented method of claim 11, further comprising:
selectively returning, responsive to an initial bit error rate of the partially-recovered host data being greater than a first recoverable bit error rate threshold and less than a second recoverable bit error rate threshold, the partially-recovered host data, wherein:
the first error correction code configuration has the first recoverable bit error rate threshold;
the second error correction code configuration has the second recoverable bit error rate threshold; and
the second recoverable bit error rate threshold is greater than the first recoverable bit error rate threshold.

17. The computer-implemented method of claim 11, further comprising:
determining, by decoding host data using a first recovery mode of the storage device, the partially-recovered host data;
selectively initiating, responsive to the partially-recovered host data, a second recovery mode to retry error correction using the first error correction code configuration; and
returning, without initiating the second recovery mode, the partially-recovered host data to the host system responsive to:
the partially-recovered host data being enabled for forward error correction; and
the residual error rate being less than the forward error correction threshold.

18. The computer-implemented method of claim 11, further comprising:
encoding, by the host system, host data using the second error correction code configuration, wherein encoding the host data by the storage device is re-encoding the host-encoded host data;
generating, by the host system, forward error correction parity data for the host-encoded host data;
receiving, by the host system, the partially-recovered host data from the storage device; and
decoding, by the host system, the partially-recovered host data using the second error code correction configuration and corresponding forward error correction parity data.

19. The computer-implemented method of claim 18, further comprising:
allocating, by the host system, a host data block in the host data to be enabled for forward error correction;
generating, by the host system, a forward error correction indicator;
associating, by the host system the forward error correction indicator with the host data block;
associating, by the host system, a corresponding forward error correction parity data block with the host data block;
sending, from the host system to the storage device, the host data block, the forward error correction indicator, and the corresponding forward error correction parity data block;
requesting, by the host system and responsive to receiving the partially-recovered host data, the corresponding forward error correction parity block from the storage device, wherein the partially-recovered host data includes partially-recovered host data from the host data block; and receiving, by the host system, the corresponding forward error correction parity block, wherein the corresponding forward error correction parity data includes the corresponding forward error correction parity block.

20. A storage system comprising:

a storage device;

a host system;

means, in the host system, for host encoding host data using a forward error correction code configuration;

means, in the storage device, for storage device encoding the host-encoded host data using a storage device error correction code configuration;

means, in the storage device, for generating, from the storage device encoded host-encoded host data, partially-recovered host-encoded host data using the storage device error correction code configuration;

means, in the storage device, for determining a residual error rate for the partially-recovered host data;

means, in the storage device, for determining a forward error correction threshold for the host system, wherein the forward error correction threshold is based on the forward error correction code configuration;

means, in the storage device, for returning, based on the residual error rate being less than the forward error correction threshold, the partially-recovered host-encoded host data to the host system; and means, in the host system, for decoding the partially-recovered host-encoded host data using the forward error correction code configuration.

\* \* \* \* \*